(12) United States Patent
Shin et al.

(10) Patent No.: US 8,841,679 B2
(45) Date of Patent: Sep. 23, 2014

(54) THIN FILM TRANSISTOR ARRAY PANEL

(71) Applicant: Samsung Display Co., Ltd., Yongin (KR)

(72) Inventors: Jae-Yong Shin, Asan-si (KR); Woo-Sung Sohn, Seoul (KR); Hong Min Yoon, Seoul (KR); Hui Gyeong Yun, Asan-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/827,572

(22) Filed: Mar. 14, 2013

(65) Prior Publication Data

US 2014/0117360 A1    May 1, 2014

(30) Foreign Application Priority Data

Oct. 26, 2012  (KR) .................. 10-2012-0119888

(51) Int. Cl.

| | | |
|---|---|---|
| H01L 29/04 | (2006.01) | |
| H01L 29/15 | (2006.01) | |
| H01L 31/036 | (2006.01) | |
| H01L 29/10 | (2006.01) | |
| H01L 31/0376 | (2006.01) | |
| H01L 31/20 | (2006.01) | |
| H01L 31/062 | (2012.01) | |
| H01L 31/113 | (2006.01) | |
| H01L 27/12 | (2006.01) | |
| H01L 27/146 | (2006.01) | |
| H01L 27/32 | (2006.01) | |
| H01L 29/49 | (2006.01) | |
| H01L 29/423 | (2006.01) | |

(52) U.S. Cl.
CPC ........ *H01L 27/1214* (2013.01); *H01L 27/1259* (2013.01); *H01L 27/14609* (2013.01); *H01L 27/14643* (2013.01); *H01L 27/3213* (2013.01); *H01L 27/3244* (2013.01); *H01L 27/3246* (2013.01); *H01L 27/3262* (2013.01); *H01L 29/4908* (2013.01); *H01L 29/42384* (2013.01)

USPC ........ 257/72; 257/59; 257/291; 257/E29.117; 257/E29.151; 257/E29.273

(58) Field of Classification Search
CPC .................... H01L 27/1214; H01L 27/14609; H01L 27/14643; H01L 27/3213; H01L 27/3244; H01L 27/3246; H01L 27/3262; H01L 29/4908; H01L 29/42384
USPC .............. 257/59, 72, 291, E29.117, E29.151, 257/E29.273
See application file for complete search history.

(56) References Cited

U.S. PATENT DOCUMENTS

| 6,819,389 B2 | 11/2004 | Imayama et al. |
| 7,145,176 B2 | 12/2006 | Kawasaki et al. |

(Continued)

FOREIGN PATENT DOCUMENTS

| JP | 3856619 | 9/2006 |
| JP | 2011-203746 | 10/2011 |

(Continued)

*Primary Examiner* — Ida M Soward
(74) *Attorney, Agent, or Firm* — H.C. Park & Associates, PLC

(57) ABSTRACT

Provided is a thin film transistor array panel. The thin film transistor array panel includes: an insulation substrate including a display area with a plurality of pixels and a peripheral area around the display area; a gate line and a data line positioned in the display area of the insulation substrate; a first driving signal transfer line and a second driving signal transfer line positioned in the peripheral area of the insulation substrate; a first insulating layer positioned on the gate line and the data line; and a first photosensitive film positioned on the first driving signal transfer line and the second driving signal transfer line, in which the first photosensitive film is disposed only in the peripheral area.

9 Claims, 58 Drawing Sheets

(56) References Cited

U.S. PATENT DOCUMENTS

| | | | |
|---|---|---|---|
| 7,164,230 B2 * | 1/2007 | Park | 313/505 |
| 7,187,122 B2 | 3/2007 | Kim | |
| 7,619,249 B2 * | 11/2009 | Kim et al. | 257/59 |
| 7,646,018 B2 * | 1/2010 | Choi et al. | 257/59 |
| 7,683,382 B2 * | 3/2010 | Jung et al. | 257/83 |
| 7,709,838 B2 * | 5/2010 | Huh et al. | 257/57 |
| 7,834,940 B2 * | 11/2010 | Uemoto | 349/2 |
| 7,885,778 B2 * | 2/2011 | Hirabayashi et al. | 702/104 |
| 7,915,613 B2 * | 3/2011 | Park | 257/59 |
| 7,915,689 B2 | 3/2011 | Cho et al. | |
| 8,022,900 B2 * | 9/2011 | Koh et al. | 345/76 |
| 8,492,764 B2 * | 7/2013 | Yamazaki et al. | 257/59 |
| 2004/0179144 A1 * | 9/2004 | Jeon | 349/43 |
| 2006/0157710 A1 * | 7/2006 | Lee et al. | 257/72 |
| 2006/0258059 A1 * | 11/2006 | Seo et al. | 438/128 |
| 2009/0023236 A1 * | 1/2009 | Miyairi et al. | 438/30 |
| 2009/0212288 A1 | 8/2009 | Kim et al. | |
| 2010/0148180 A1 * | 6/2010 | Kim et al. | 257/59 |
| 2010/0187538 A1 * | 7/2010 | Koo et al. | 257/72 |
| 2011/0084273 A1 * | 4/2011 | Yamazaki et al. | 257/43 |
| 2011/0304604 A1 * | 12/2011 | Jo et al. | 345/212 |
| 2011/0318889 A1 | 12/2011 | Chida | |
| 2012/0049184 A1 * | 3/2012 | Umezaki et al. | 257/43 |
| 2013/0049029 A1 * | 2/2013 | Kim et al. | 257/88 |

FOREIGN PATENT DOCUMENTS

| | | |
|---|---|---|
| KR | 10-2009-0126729 | 12/2009 |
| KR | 10-2010-0031976 | 3/2010 |
| KR | 10-2011-0013799 | 2/2011 |
| KR | 10-2011-0100842 | 9/2011 |

* cited by examiner 140  129  110  180

140 151 169 179 110 180

THIN FILM TRANSISTOR ARRAY PANEL

CROSS-REFERENCE TO RELATED APPLICATION

This application claims priority from and the benefit of Korean Patent Application No. 10-2012-0119888, filed on Oct. 26, 2012, which is hereby incorporated by reference for all purposes as if fully set forth herein.

BACKGROUND OF THE INVENTION

1. Field of the Invention

Exemplary embodiments of the present invention relate to a thin film transistor array panel and a manufacturing method thereof.

2. Description of the Background

A liquid crystal display which is one of the most common types of flat panel is displays currently in use, may include two sheets of panels with field generating electrodes such as a pixel electrode, and a common electrode and a liquid crystal layer interposed therebetween. The liquid crystal display generates an electric field in the liquid crystal layer by applying voltage to the field generating electrodes and determines the direction of liquid crystal molecules of the liquid crystal layer by the generated electric field to control polarization of incident light, thereby displaying images.

When a contact hole for connecting driving signal transfer lines transferring driving signals to the liquid crystal display is formed, in the case where a thickness of a passivation layer is large, a height of the contact hole for exposing the driving signal transfer lines is increased and thus a width of the contact hole is increased. In addition, as the width of the contact hole for exposing the driving signal transfer lines of a driver is increased, it is susceptible for moisture or static electricity to flow in through the contact hole.

Further, in order to protect a driving circuit unit from moisture or static electricity, it is desirable that the thickness of the passivation layer is maintained.

Furthermore, a photolithography process may be used to pattern a thin film layer of a thin film transistor, and in this case, as the number of photomasks is increased, a manufacturing cost is increased.

The above information disclosed in this Background section is only to set up Applicant's recognition of problems within existing art and merely for enhancement of understanding of the background of the invention based on the identified source of problems, and therefore the above information cannot be used as prior art in determining obviousness into the present invention.

SUMMARY OF THE INVENTION

These and other needs are addressed by the present invention, in which exemplary embodiments provide a thin film transistor array panel having advantages of protecting a driving circuit unit from moisture or static electricity while controlling a height of a contact hole of the thin film transistor array panel and a manufacturing method thereof having advantages of preventing an increase in a manufacturing cost.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose a thin film transistor array panel. The thin film transistor array panel includes a substrate including a display area including a plurality of pixels and a peripheral area outside the display area. The thin film transistor array panel also includes a gate line and a data line disposed in the display area of the insulation substrate. The thin film transistor array panel also includes a first driving signal transfer line and a second driving signal transfer line disposed in the peripheral area of the insulation substrate. The thin film transistor array panel also includes a first insulating layer is disposed on the gate line and the data line; and a first photosensitive film positioned on the first driving signal transfer line and the second driving signal transfer line. The first photosensitive film is disposed only in the peripheral area.

The first insulating layer may contain an organic insulator.

The first insulating layer may be a color filter.

The thin film transistor array panel may further include a second insulating layer positioned on the first insulating layer.

The thin film transistor array panel may further include a third insulating layer positioned in the display area and the peripheral area and positioned below the first insulating layer and the first photosensitive film pattern.

The thin film transistor array panel may further include a thin film transistor connected to the gate line and the data line; and a pixel electrode connected to the thin film transistor and positioned on the first insulating layer, in which the pixel electrode may include a plurality of minute branches.

The plurality of minute branches of the pixel electrode may extend in a plurality of different directions.

Exemplary embodiments of the present invention disclose a manufacturing method of a thin film transistor array panel. The method includes forming a gate line in a display area of a substrate and forming a first driving signal transfer line in a peripheral area of the substrate. The method also includes forming a data line in the display area of the substrate and forming a second driving signal transfer line in the peripheral area of the substrate. The method includes forming a first insulating layer on the gate line and the data line. The method includes forming a photosensitive film on the first insulating layer. The method includes forming a first photosensitive film pattern disposed in the display area and a second photosensitive film pattern disposed in the peripheral area, by exposing and developing the photosensitive film. The method includes etching the first insulating layer using the first photosensitive film pattern as an etching mask. The method includes removing the first photosensitive film pattern and decreasing a height of the second photosensitive film pattern.

The forming of the first insulating layer may include laminating an organic insulator.

The forming of the first insulating layer may include laminating a color filter.

The manufacturing method of a thin film transistor array panel may further include forming a second insulating layer on the first insulating layer.

The manufacturing method of a thin film transistor array panel may further include forming a third insulating layer in the display area and the peripheral area of the insulation substrate, in which in the forming of the third insulating layer, the third insulating layer may be formed below the first insulating layer and the second photosensitive film pattern.

The manufacturing method of a thin film transistor array panel may further include forming a pixel electrode connected to the gate line and the data line and positioned on the first insulating layer, in which in the forming of the pixel electrode, the pixel electrode including a plurality of minute branches may be formed.

In the forming of the pixel electrode, the plurality of minute branches may extend in a plurality of different directions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
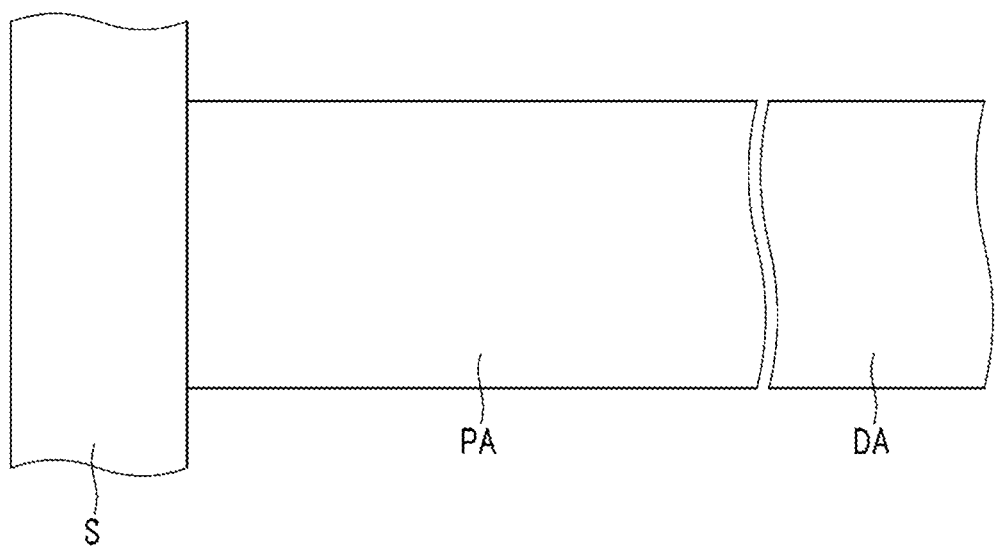
FIG. 1 is a layout view illustrating a thin film transistor array panel according to exemplary embodiments of the present invention.

An apparatus and method for manufacturing a thin film transistor array substrate. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

In the drawings, the thickness of layers, films, panels, and regions are exaggerated for clarity. Like reference numerals designate like elements throughout the specification. It will be understood that when an element or layer is referred to as being "on" or "connected to" is another element or layer, it can be directly on or directly connected to the other element or layer, or intervening elements or layers may be present. In contrast, when an element or layer is referred to as being "directly on" or "directly connected to" another element or layer, there are no intervening elements or layers present.

Referring to FIG. 1, a thin film transistor array panel according to exemplary embodiments of the present invention is described. FIG. 1 is a layout view illustrating a thin film transistor array panel according to exemplary embodiments of the present invention.

Referring to FIG. 1, a thin film transistor array panel according to exemplary embodiments of the present invention may include a display area DA and a peripheral area PA positioned around the display area DA.

A sealant S for coupling the thin film transistor array panel and an upper panel facing the thin film transistor array panel is positioned at an end of the peripheral area PA.

A plurality of pixels is formed in the display area DA to display a desired image.

The peripheral area PA is disposed outside the display area DA, and signal lines transferring several signals required to display the image and a thin film transistor for driving are formed therein.

Figure 2:
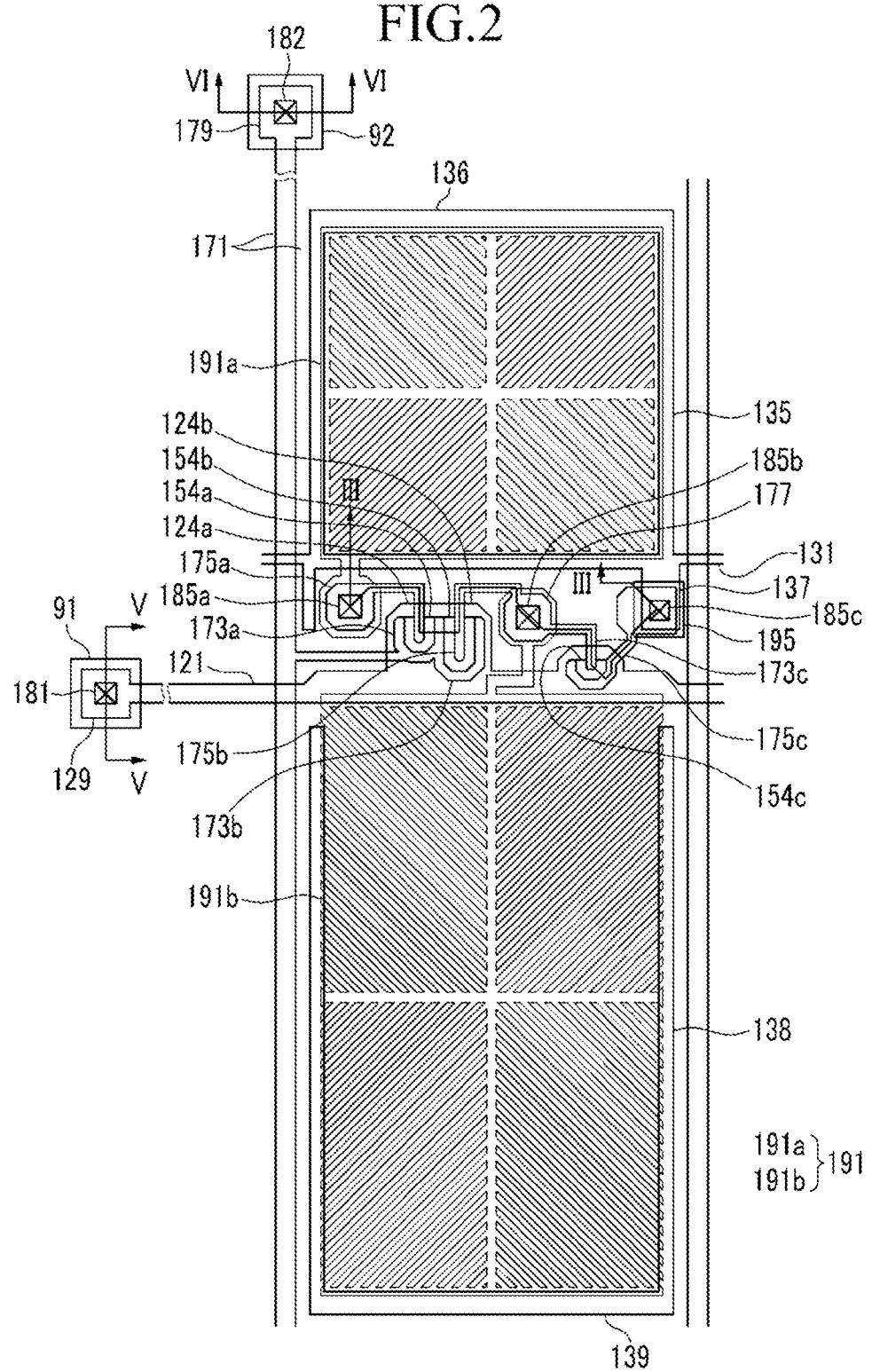
FIG. 2 is a layout view illustrating one pixel of the thin film transistor array panel according to the exemplary embodiments of the present invention.
Figure 3:
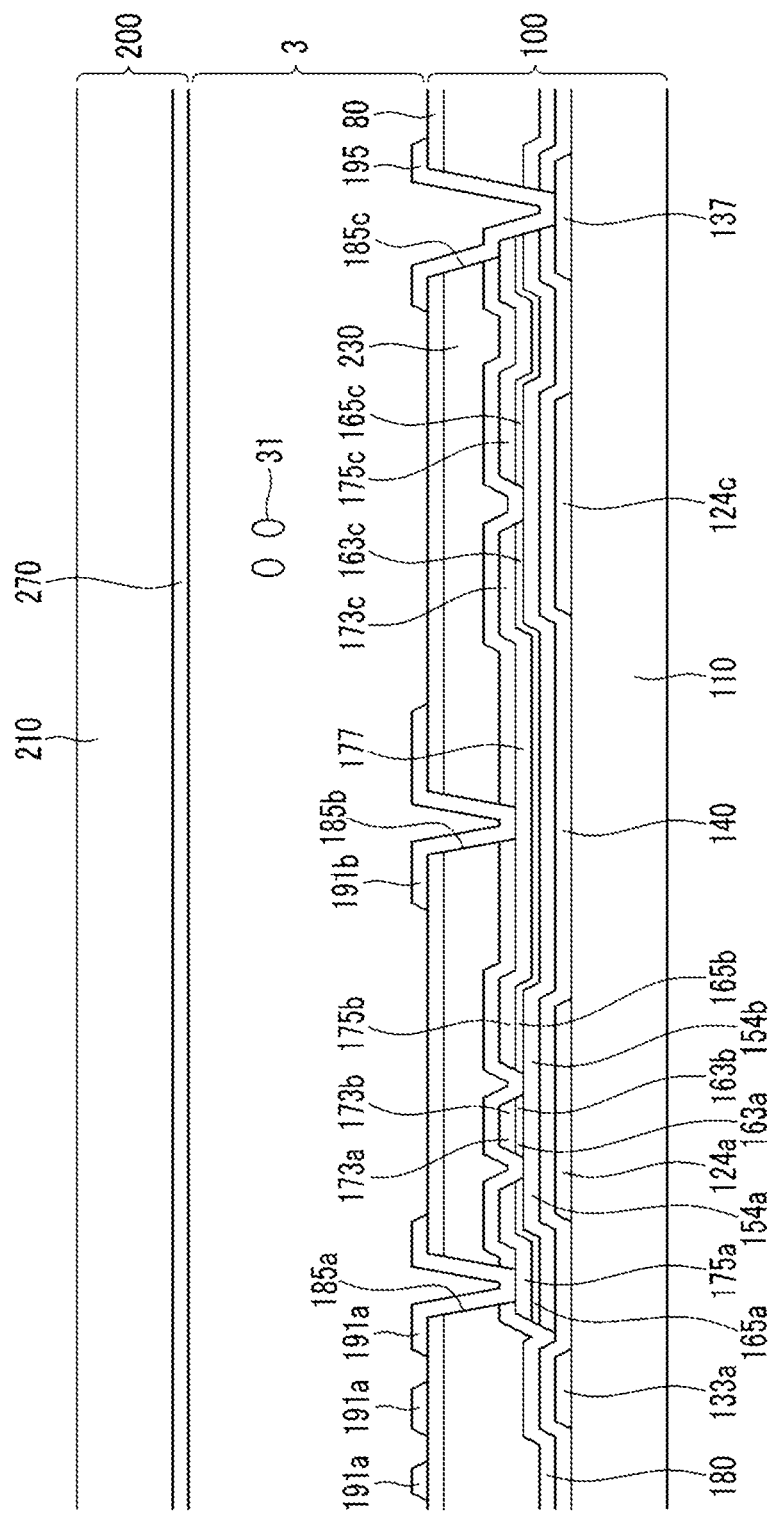
FIG. 3 is a cross-sectional view illustrating the thin film transistor array panel of FIG. 2 taken along line III-III.
Figure 4:
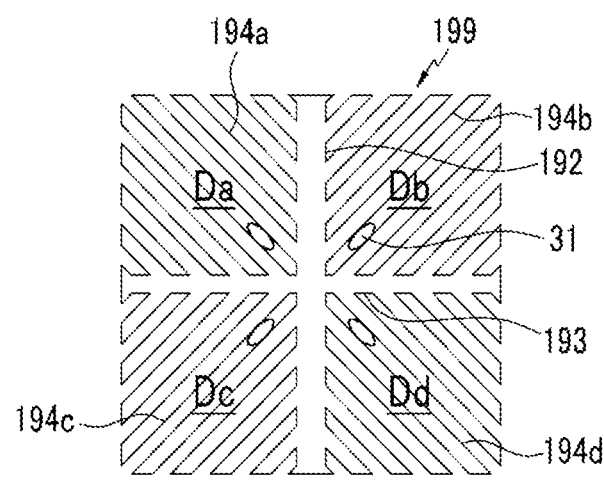
FIG. 4 is a plan view illustrating a basic area of a pixel electrode of the thin film transistor array panel according to the exemplary embodiments of the present invention.
Figure 5:
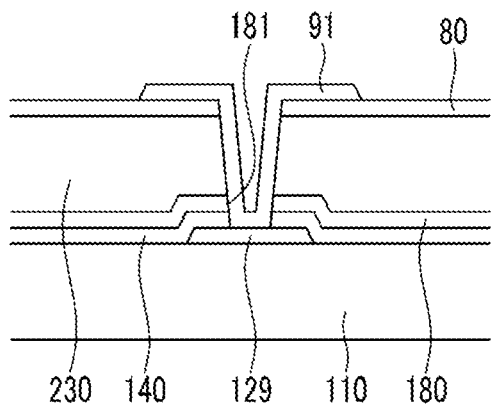
FIG. 5 is a cross-sectional view illustrating the thin film transistor array panel of FIG. 2 taken along line V-V.
Figure 6:
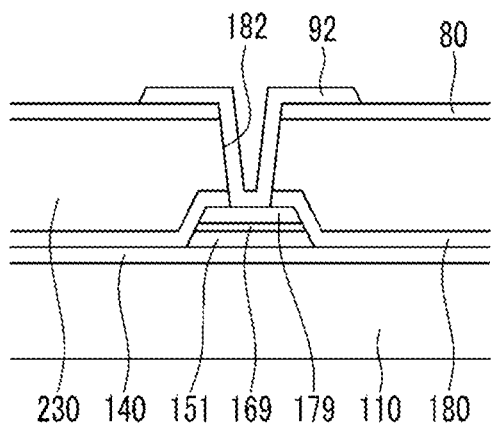
FIG. 6 is a cross-sectional view illustrating the thin film transistor array panel of FIG. 2 taken along line VI-VI.

FIG. 2 is a layout view illustrating one pixel of the thin film transistor array panel according to the exemplary embodiments of the present invention, and FIG. 3 is a cross-sectional view illustrating the thin film transistor array panel of FIG. 2 taken along line III-III. FIG. 4 is a plan view illustrating a basic area of a pixel electrode of the thin film transistor array panel according to the exemplary embodiments of the present invention. FIG. 5 is a cross-sectional view illustrating the thin film transistor array panel of FIG. 2 taken along line V-V, and FIG. 6 is a cross-sectional view illustrating the thin film transistor array panel of FIG. 2 taken along line VI-VI.

Referring to FIGS. 2, 3, 5, and 6, a thin film transistor array panel 100 according to the exemplary embodiments may include a gate line 121 and a divided reference voltage line 131 formed on a first insulation substrate 110 made of transparent glass, or plastic.

The gate line 121 includes a first gate electrode 124a, a second gate electrode 124b, a third gate electrode 124c, and a gate pad 129 for connection with another layer or an external driving circuit.

The divided reference voltage line 131 includes first storage electrodes 135 and 136 and a reference electrode 137. Second storage electrodes 138 and 139 which are not connected to the divided reference voltage line 131, but overlapped with a second subpixel electrode 191b are disposed.

A gate insulating layer 140 is formed on the gate line 121 and the divided reference voltage line 131.

A semiconductor 151 including a first semiconductor 154a, a second semiconductor 154b, and a third semiconductor 154c is formed on the gate insulating layer 140. The semiconductor 151 extends along a data line 171 to be described below to be disposed below a data pad 179.

A plurality of ohmic contacts 163a, 165a, 163b, 165b, 163c, 165c, and 169 is formed on the semiconductors 154a, 154b, and 154c. The semiconductors 154a, 154b, and 154c may contain oxide semiconductors, and in the case where the semiconductors 154a, 154b, and 154c are the oxide semiconductors, the ohmic contacts 163a, 165a, 163b, 165b, 163c, 165c, and 169 may be omitted.

A data conductor 171, 173a, 173b, 173c, 175a, 175b, 175c, and 179 that includes is a plurality of data lines 171 including a first source electrode 173a and a second source electrode 173b, and a data pad 179 for connection with another layer or an external driving circuit, a first drain electrode 175a, a second drain electrode 175b, a third source electrode 173a, and a third drain electrode 175c is formed on the ohmic contacts 163a, 165a, 163b, 165b, 163c, 165c, and 169.

The data conductor, the semiconductors and the ohmic contacts which are positioned therebelow may be simultaneously formed by using one mask.

The first gate electrode 124a, the first source electrode 173a, and the first drain electrode 175a form a first thin film transistor (TFT) together with the first semiconductor 154a, and a channel of the thin film transistor is formed in the semiconductor 154a between the first source electrode 173a and the first drain electrode 175a. Similarly, the second gate electrode 124b, the second source electrode 173b, and the second drain electrode 175b form a second thin film transistor together with the second semiconductor 154b, and a channel thereof is formed in the semiconductor 154b between the second source electrode 173b and the second drain electrode 175b. In addition, the third gate electrode 124c, the third source electrode 173c, and the third drain electrode 175c form a third thin film transistor together with the third semiconductor 154c, and a channel thereof is formed in the semiconductor 154c between the third source electrode 173c and the third drain electrode 175c.

The second drain electrode 175b is connected with the third source electrode 173c and includes an extension 177 which is widely extended.

A passivation layer 180 is formed on the data conductor 171, 173c, 175a, 175b, and 175c and the exposed semiconductors 154a, 154b, and 154c. The passivation layer 180 may include an inorganic insulating layer such as silicon nitride or silicon oxide. The passivation is layer 180 may prevent a pigment of a color filter 230 from flowing in the exposed semiconductors 154a, 154b, and 154c.

The color filter 230 is formed on the passivation layer 180. The color filter 230 extends along two adjacent data lines in a vertical direction. Although not illustrated, the thin film transistor array panel according to the exemplary embodiments of the present invention may further include a light blocking member, and the light blocking member may be disposed in a region where the data line 171 and the first to third thin film transistors are positioned.

An overcoat 80 is formed on the color filter 230. The overcoat 80 may include an inorganic insulating layer such as silicon nitride or silicon oxide. The overcoat 80 prevents the color filter 230 from being lifted and suppresses the contamination of a liquid crystal layer 3 due to an organic material such as a solvent flowing from the color filter 230 to prevent a defect such as an afterimage that may be caused when a screen is driven.

A first contact hole 185a and a second contact hole 185b that expose the first drain electrode 175a and the second drain electrode 175b are formed in the passivation layer 180, the color filter 230, and the overcoat 80.

A third contact hole 185c exposing a part of a reference electrode 137 and a part of the third drain electrode 175c is formed in the passivation layer 180, the color filter 230, the overcoat 80, and the gate insulating layer 140, and the third contact hole 185c is covered by a first connecting member 195. The first connecting member 195 electrically connects the reference electrode 137 and the third drain electrode 175c which are exposed through the third contact hole 185c.

Referring to FIGS. 5 and 6, a fourth contact hole 181 exposing the gate pad 129 is formed in the passivation layer 180, the color filter 230, the overcoat 80, and the gate insulating is layer 140, and a fifth contact hole 182 exposing the data pad 179 is formed in the passivation layer 180, the color filter 230, and the overcoat 80. A second connecting member 91 is formed on the fourth contact hole 181, and a third connecting member 92 is formed in the fifth contact hole 182.

A plurality of pixel electrodes 191 is formed on the overcoat 80. The respective pixel electrodes 191 are separated from each other with the gate line 121 therebetween, and each pixel electrode 191 includes a first subpixel electrode 191a and a second subpixel electrode 191b which are adjacent to each other in a column direction based on the gate line 121. The pixel electrode 191 may be made of a transparent material such as ITO and IZO. The pixel electrode 191 may also be made of a transparent conductive material such as ITO or IZO or a reflective metal such as aluminum, silver, chromium, or an alloy thereof.

Each of the first subpixel electrode 191a and the second subpixel electrode 191b includes a basic electrode 199 or one or more modifications thereof illustrated in FIG. 3.

The first subpixel electrode 191a and the second subpixel electrode 191b are physically and electrically connected to the first drain electrode 175a and the second drain electrode 175b through the first contact hole 185a and the second contact hole 185b, respectively and receive data voltages from the first drain electrode 175a and the second drain electrode 175b. In this case, some of the data voltages applied to the second drain electrode 175b are divided through the third source electrode 173c, and a magnitude of the voltage applied to the first subpixel electrode 191a is larger than a magnitude of the voltage applied to the second subpixel electrode 191b.

The first subpixel electrode 191a and the second subpixel electrode 191b to which the data voltages are applied generate electric fields together with a common electrode 270 formed on a second insulation substrate 210 of an upper panel 200 facing the thin film transistor array panel, and as a result, liquid crystal molecules 31 of the liquid crystal layer 3 between two panels 100 and 200 are inclined in a predetermined direction in response to the electric fields. As such, luminance of light passing through the liquid crystal layer 3 depends on the determined direction of the liquid crystal molecules 31.

As illustrated in FIG. 4, the overall shape of the basic electrode 199 is a quadrangle, and the basic electrode 199 includes a cross stem configured by a horizontal stem 193 and a vertical stem 192 which is perpendicular to the horizontal stem 193. Further, the basic electrode 199 is divided into a first subregion Da, a second subregion Db, a third subregion Dc, and a fourth subregion Dd by the horizontal stem 193 and the vertical stem 192, and the respective subregions Da-Dd include a plurality of first minute branches 194a, a plurality of second minute branches 194b, a plurality of third minute branches 194c, and a plurality of fourth minute branches 194d.

The first minute branch 194a extends obliquely in an upper left direction from the horizontal stem 193 or the vertical stem 192, and the second minute branch 194b extends obliquely in an upper right direction from the horizontal stem 193 or the vertical stem 192. Further, the third minute branch 194c extends obliquely in a lower left direction from the horizontal stem 193 or the vertical stem 192, and the fourth minute branch 194d extends obliquely in a lower right direction from the horizontal stem 193 or the vertical stem 192.

The first to fourth minute branches 194a, 194b, 194c, and 194d form angles of about 45 or 135 degrees with the gate lines 121a and 121b or the horizontal stem 193. Further, the minute branches 194a, 194b, 194c, and 194d of two adjacent subregions Da, Db, Dc, and Dd are perpendicular to each other.

Widths of the minute branches 194a, 194b, 194c, and 194d may be 2.5 μm to 5.0 μm, and a distance between the adjacent minute branches 194a, 194b, 194c, and 194d may be 2.5 μm to 5.0 μm in one subregion Da, Db, Dc, or Dd.

According to exemplary embodiments of the present invention, the widths of the minute branches 194a, 194b, 194c, and 194d may be increased as being closer to the horizontal stem 193 or the vertical stem 192, and a difference between the largest portion and the smallest portion in the width of one minute branch 194a, 194b, 194c, or 194d may be 0.2 μm to 1.5 μm.

The first subpixel electrode 191a and the second subpixel electrode 191b are connected with the first drain electrode 175a or the second drain electrode 175b through the first contact hole 185a and the second contact hole 185b and receive the data voltages from the first drain electrode 175a and the second drain electrode 175b. In this case, sides of the first to fourth minute branches 194a, 194b, 194c, and 194d distort the electric field to generate horizontal components that determine inclined directions of the liquid crystal molecules 31. The horizontal components of the electric field are substantially parallel to the sides of the first to fourth minute branches 194a, 194b, 194c, and 194d. Accordingly, as illustrated in FIG. 4, the liquid crystal molecules 31 are inclined in parallel directions to longitudinal directions of the minute branches 194a, 194b, 194c, and 194d. Since one pixel electrode 191 includes four subregions Da-Dd having different longitudinal directions of the minute branches 194a, 194b, 194c, and 194d, the inclined directions of the liquid crystal molecules 31 are substantially four directions, and four domains having different alignment directions of the liquid crystal molecules 31 are formed on the liquid crystal layer 3. As such, when the inclined directions of the liquid crystal molecules are various, a reference viewing angle of the liquid crystal display is increased.

Figure 7:
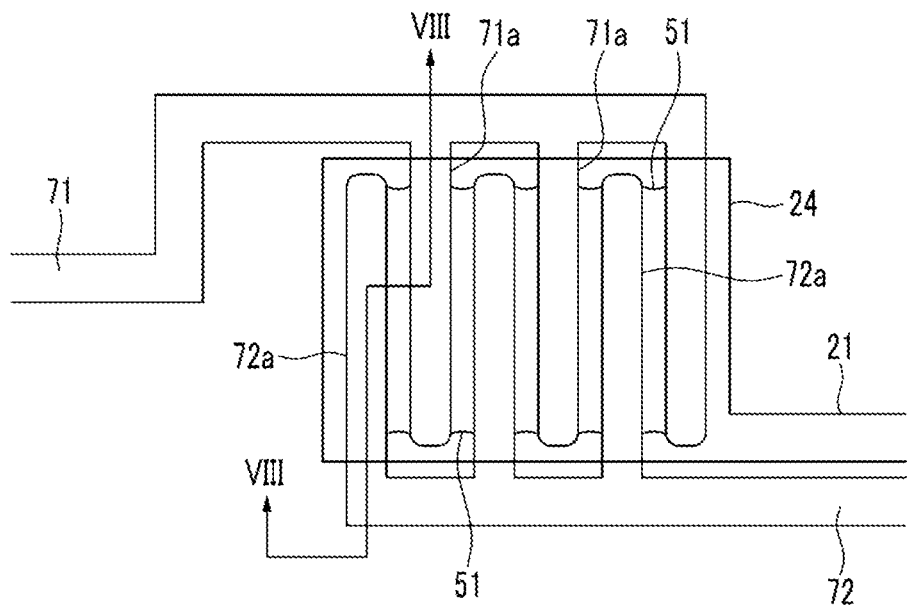
FIG. 7 is a layout view illustrating a driving transistor of a driver in the thin film transistor array panel according to the exemplary embodiments of the present invention.
Figure 8:
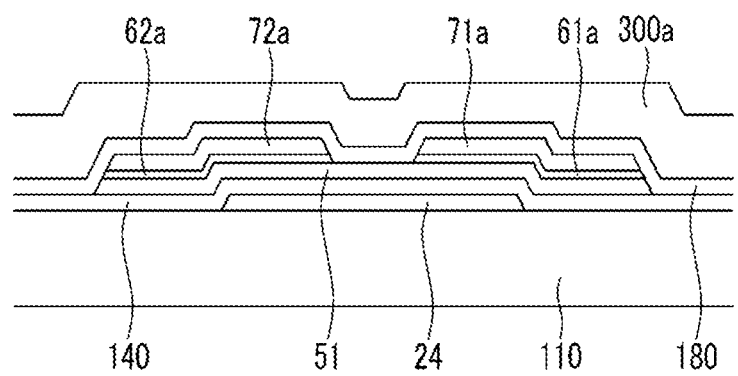
FIG. 8 is a cross-sectional view illustrating the thin film transistor array panel of FIG. 7 taken along line VIII-VIII.
Figure 9:
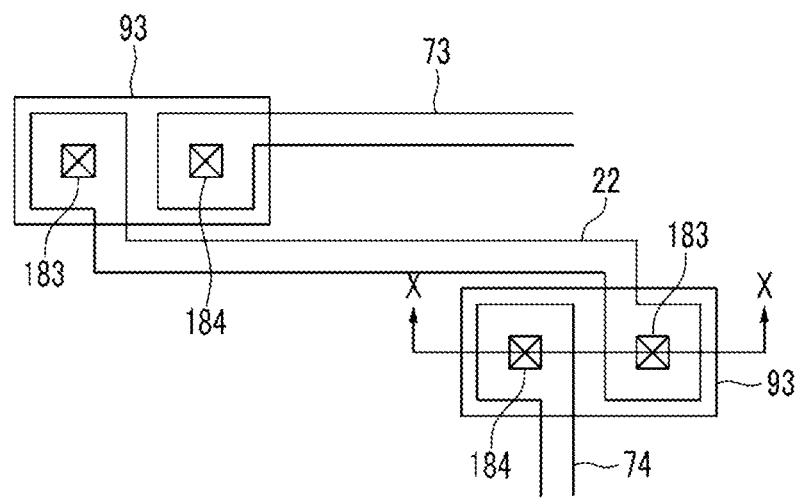
FIG. 9 is a layout view illustrating a part of signal lines of a driver in the thin film is transistor array panel according to the exemplary embodiments of the present invention.
Figure 10:
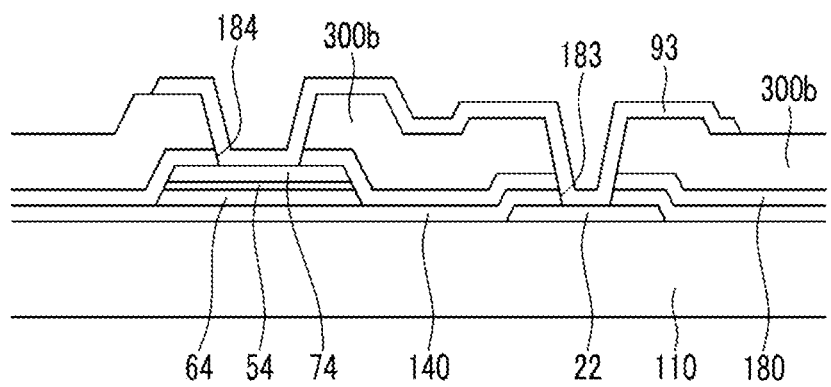
FIG. 10 is a cross-sectional view illustrating the thin film transistor array panel of FIG. 9 taken along line X-X.

Then, referring to FIGS. 7 to 10, a driver of the thin film transistor array panel is according to the exemplary embodiments of the present invention is described. FIG. 7 is a layout view illustrating a driving transistor of a driver in the thin film transistor array panel according to the exemplary embodiments of the present invention, and FIG. 8 is a cross-sectional view illustrating the thin film transistor array panel of FIG. 7 taken along line VIII-VIII. FIG. 9 is a layout view illustrating a part of signal lines of a driver in the thin film transistor array panel according to the exemplary embodiments of the present invention, and FIG. 10 is a cross-sectional view illustrating the thin film transistor array panel of FIG. 9 taken along line X-X.

First, referring to FIGS. 7 and 8, a driving transistor formed in the peripheral area PA of the thin film transistor array panel according to the exemplary embodiments of the present invention is described.

Referring to FIGS. 7 and 8, a driving control signal line 21 is formed on an insulation substrate 110. The driving control signal line 21 includes a driving control electrode 24.

The driving control signal line 21 is simultaneously formed on the same layer as a gate line 121 of the display area DA.

A gate insulating layer 140 is positioned on the driving control signal line 21 and the driving control electrode 24. A driving semiconductor 51 is positioned on the gate insulating layer 140. Driving ohmic contacts 61a and 61b are formed on the driving semiconductor 51.

A driving input signal line 71 including a driving input electrode 71a and a driving output signal line 72 including a driving output electrode 72a are formed on the driving ohmic contacts 61a and 61b.

The driving input signal line 71 including a driving input electrode 71a and the driving output signal line 72 including a driving output electrode 72a, and the driving is semiconductor 51 and the driving ohmic contacts 61a and 61b which are positioned therebelow may be simultaneously formed by using one mask. Further, the driving input signal line 71 including a driving input electrode 71a and the driving output signal line 72 including a driving output electrode 72a may be simultaneously formed on the same layer as a data conductor of the display area DA, and the driving semiconductor 51 and the driving ohmic contacts 61a and 61b may be simultaneously formed on the same layer as the semiconductors 154a, 154b, and 154c of the display area DA and the plurality of ohmic contacts 163a, 165a, 163b, 165b, 163c, 165c, and 169.

The passivation layer 180 is formed on the driving input signal line 71, the driving output signal line 72, and the gate insulating layer 140.

However, unlike the pixel area formed in the display area DA, in the driving transistor formed in the peripheral area PA of the thin film transistor array panel, the color filter 230 and the overcoat 80 are not positioned on the driving transistor, but a first photosensitive film 300a is positioned on the driving transistor. The first photosensitive film 300a covers and protects the driving transistor.

Next, referring to FIGS. 9 and 10, driving signal transfer lines formed in the peripheral area PA of the thin film transistor array panel according to the exemplary embodiments of the present invention are described. In this application, the use of "line" or "lines" does not require a straight line shape. In other words, a signal transfer line can have any suitable shape.

Referring to FIGS. 9 and 10, a first driving signal transfer line 22 and second driving signal transfer lines 73 and 74 are included in the peripheral area PA of the thin film transistor array panel according to the exemplary embodiments of the present invention. The is first driving signal transfer line 22 and the second driving signal transfer lines 73 and 74 transfer various signals required for the driver for driving the display area DA.

The first driving signal transfer line 22 is formed on the insulation substrate 110. The first driving signal transfer line 22 may be simultaneously formed on the same layer as the gate line 121 of the display area DA.

The gate insulating layer 140 is positioned on the first driving signal transfer line 22.

The second driving signal transfer lines 73 and 74 are positioned on the gate insulating layer 140. The second driving signal transfer lines 73 and 74 may be simultaneously formed on the same layer as the data conductor of the display area DA. A dummy semiconductor 54 and a dummy ohmic contact 64 are positioned below the second driving signal transfer line 74.

The second driving signal transfer line 74, the dummy semiconductor 54, and the dummy ohmic contact 64 may be simultaneously formed by using one mask. Further, the second driving signal transfer line 74, the dummy semiconductor 54, and the dummy ohmic contact 64 may be simultaneously formed with the data conductor of the display area DA, the semiconductors 154a, 154b, and 154c, and the ohmic contacts 163a, 165a, 163b, 165b, 163c, 165c, and 169. Further, the second driving signal transfer line 74, the dummy semiconductor 54, and the dummy ohmic contact 64 may be simultaneously formed with the driving input signal line 71 and the driving output signal line 72 of the driving transistor, the driving semiconductor 51, and the driving ohmic contacts 61a and 61b.

The passivation layer 180 is formed on the gate insulating layer 140 and the second driving signal transfer line 74. A second photosensitive film 300b is formed on the passivation layer 180. An opening exposing a part of the passivation layer 180 is formed in the second photosensitive film 300b.

A sixth contact hole 183 exposing a part of the first driving signal transfer line 22 is formed in the passivation layer 180 and the gate insulating layer 140, and a seventh contact hole 184 exposing a part of the second driving signal transfer lines 73 and 74 is formed in the passivation layer 180. The sixth contact hole 183 and the seventh contact hole 184 are arranged with the opening of the second photosensitive film 300b, and the passivation layer 180 and the gate insulating layer 140 are etched and formed by using the second photosensitive film 300b having the opening as an etching mask.

A fourth connecting member 93 is formed on the sixth contact hole 183 and the seventh contact hole 184. The fourth connecting member 93 connects the first driving signal transfer line 22 exposed by the sixth contact hole 183 and the second driving signal transfer lines 73 and 74 exposed by the seventh contact hole 184 to transfer a driving signal transferred through the first driving signal transfer line 22 to the second driving signal transfer lines 73 and 74 or transfer a driving signal transferred through the second driving signal transfer lines 73 and 74 to the first driving signal transfer line 22.

As illustrated in FIGS. 7 to 10, the color filter 230 and the overcoat 80 which are positioned in the display area DA are not positioned in the peripheral area PA of the thin film transistor array panel according to the exemplary embodiments of the present invention. However, the first photosensitive film 300a and the second photosensitive film 300b are positioned in the peripheral area PA of the thin film transistor array panel according to the exemplary embodiments of the present invention to protect a driving circuit unit including the driving transistor and the driving signal transfer line from moisture or static electricity. Further, is the sixth contact hole 183 and the seventh contact hole 184 exposing the driving signal transfer lines 22, 73, and 74 are formed by etching the passivation layer 180 and the gate insulating layer 140 by using the second photosensitive film 300b as an etching mask, and as a result, since the color filter 230 and the overcoat 80 which have relatively thick thicknesses are not etched together, a height of the contact hole may be decreased and thus a width of the contact hole is decreased. Accordingly, an inflow amount of moisture or static electricity through the contact hole is decreased.

Then, a manufacturing method of the thin film transistor array panel according to the exemplary embodiments of the present invention will be described with reference to FIGS. 11 to 35, in addition to FIGS. 1, 2, 3, 5, 6, and 7 to 10. FIGS. 11 to 35 are cross-sectional views sequentially illustrating a manufacturing method of the thin film transistor array panel according to the exemplary embodiment of the present invention, which are cross-sectional views taken along lines III-III, V-V, and VI-VI of FIG. 2, line VIII-VIII of FIG. 7, and line X-X of FIG. 9.

First, the display area DA is described with reference to FIGS. 11 to 13.

Figure 11:
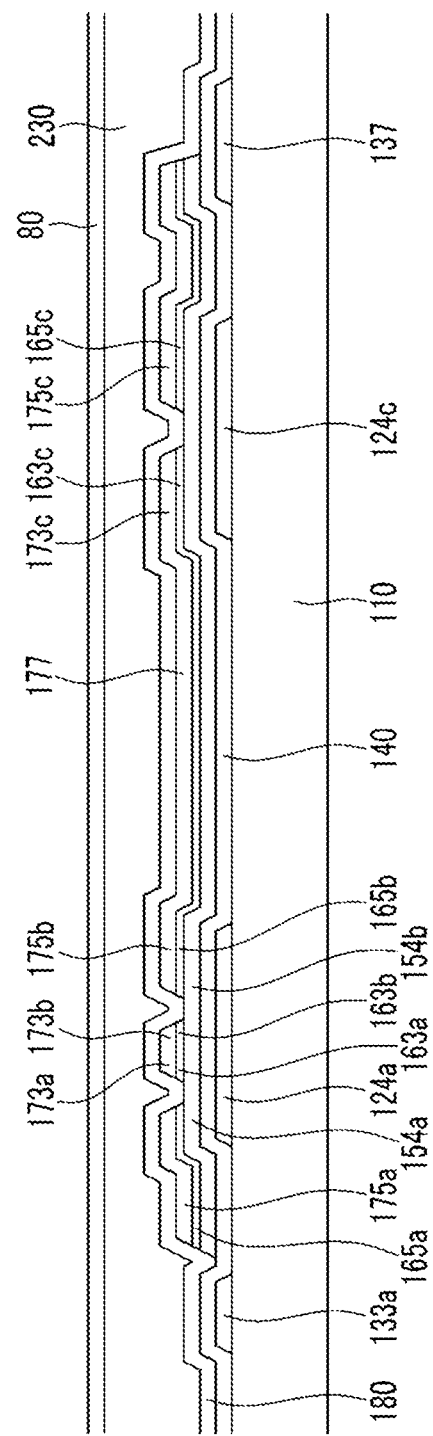
FIGS. 11 to 35 are cross-sectional views sequentially illustrating a manufacturing method of the thin film transistor array panel according to the exemplary embodiments of the present invention.
Figure 12:
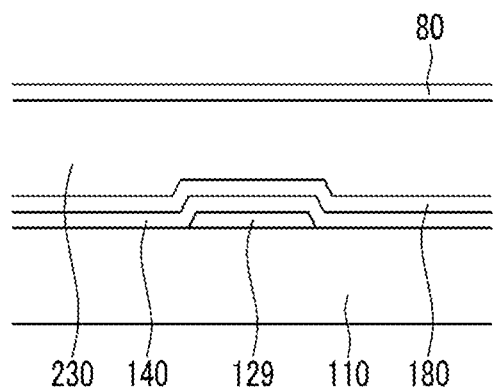
Figure 13:
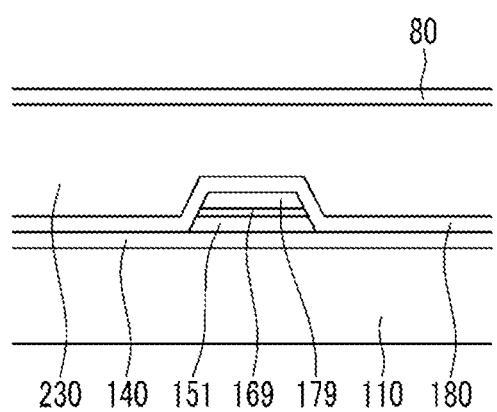

As illustrated in FIGS. 11 to 13, the gate line 121 including the first gate electrode 124a, the second gate electrode 124b, the third gate electrode 124c, and the gate pad 129, and the divided reference voltage line 131 including the storage electrodes 135 and 136 and the reference electrode 137 are formed on the insulation substrate 110. The gate insulating layer 140 is laminated, and the semiconductors 154a, 154b, and 154c, the ohmic contacts 163a, 165a, 163b, 165b, 163c, 165c, and 169, and the data conductor 171, 173a, 173b, 173c, 175a, 175b, 175c, and 179 that includes the plurality of data lines 171 including the first source electrode 173a and the second source electrode 173b, the first drain electrode 175a, the second drain electrode 175b, the third source electrode 173a, and the third drain electrode 175c are formed.

The semiconductors 154a, 154b, and 154c, the ohmic contacts 163a, 165a, 163b, 165b, 163c, 165c, and 169, and the data conductor 171, 173a, 173b, 173c, 175a, 175b, 175c, and 179 are simultaneously formed by using one mask and have substantially the same plane shapes except for a part of the channel of the thin film transistor.

The passivation layer 180 is laminated on the data conductor 171, 173a, 173b, 173c, 175a, 175b, 175c, and 179, the color filter 230 is laminated on the passivation layer 180, and the overcoat 80 is laminated on the color filter 230.

Figure 14:
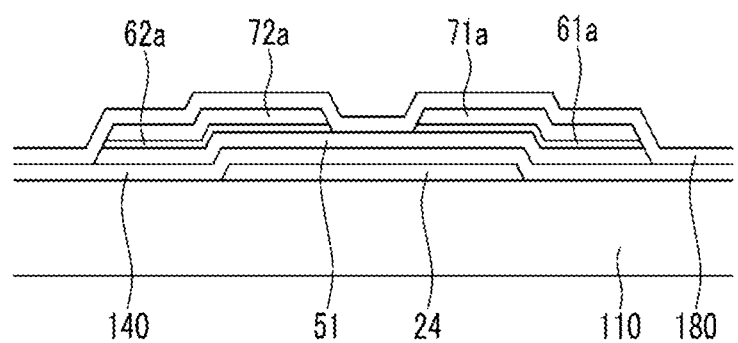
Figure 15:
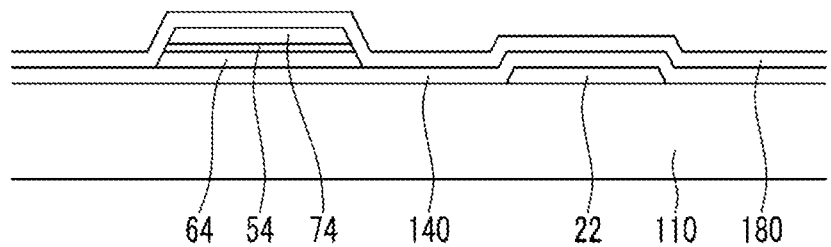
Figure 16:
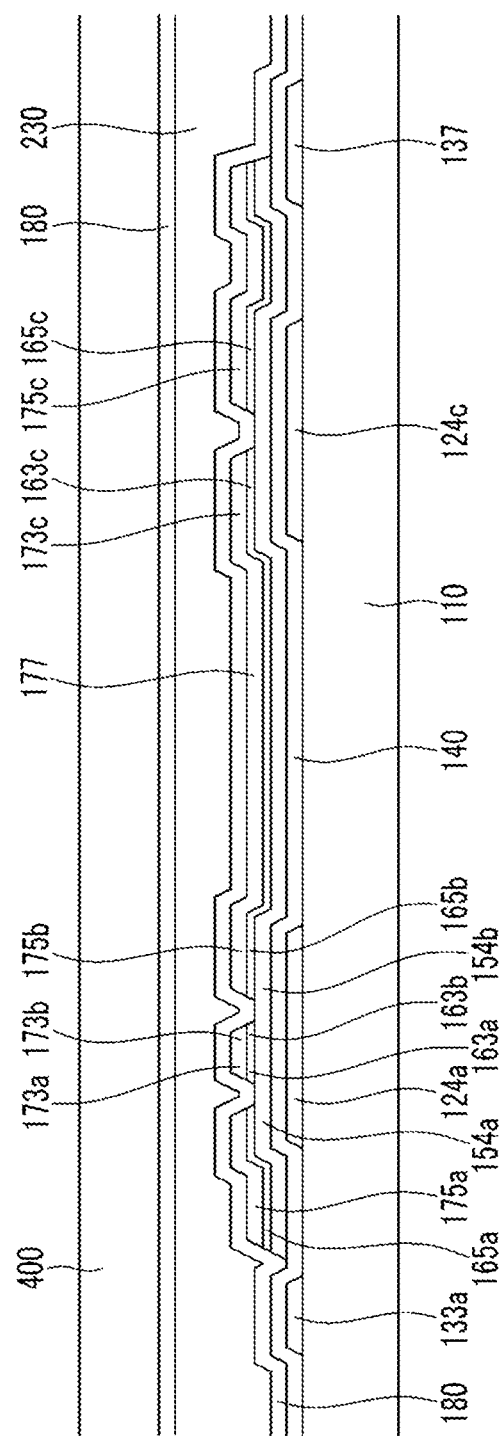
Figure 17:
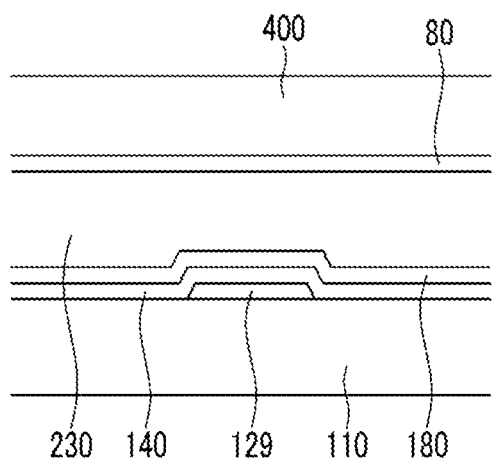
Figure 18:
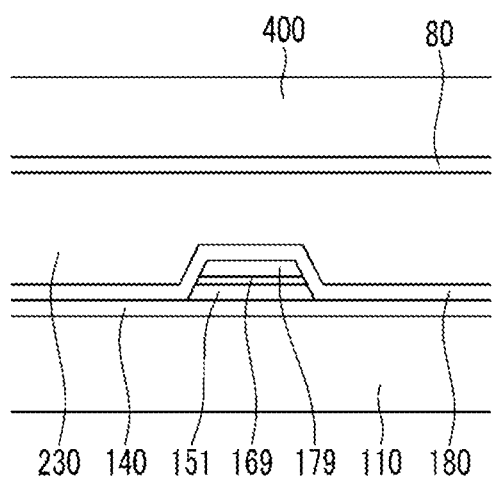
Figure 19:
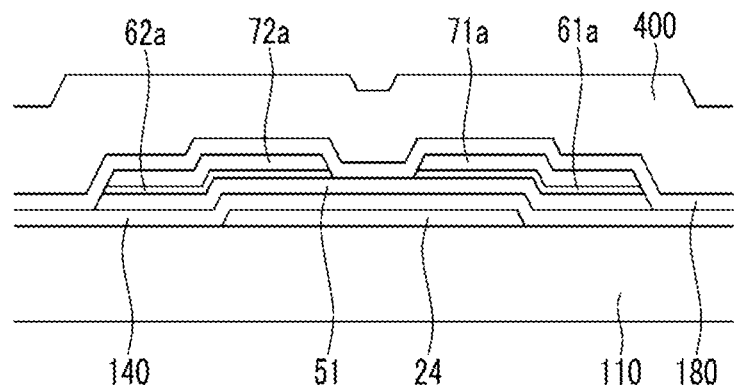
Figure 20:
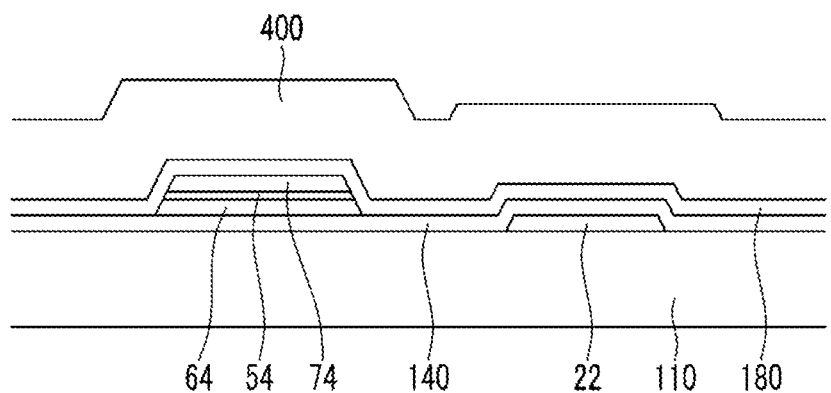
Figure 21:
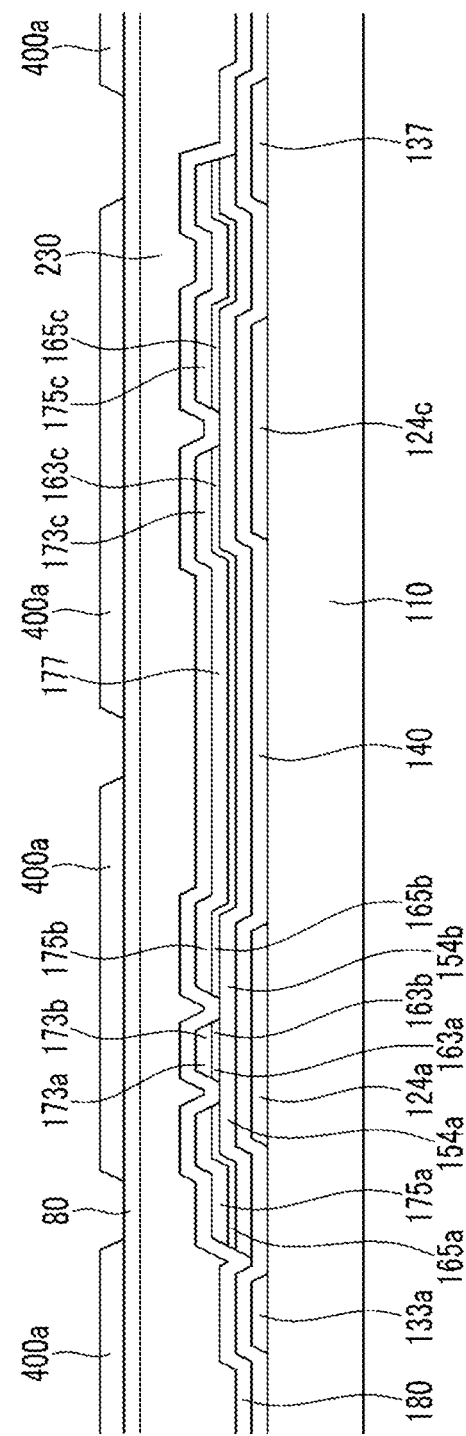
Figure 22:
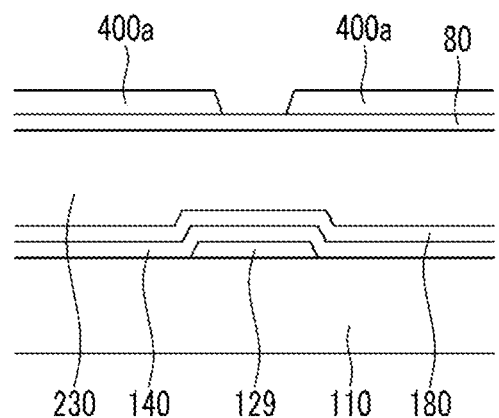
Figure 23:
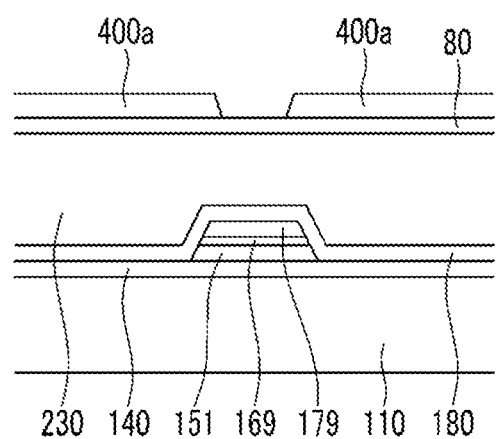
Figure 24:
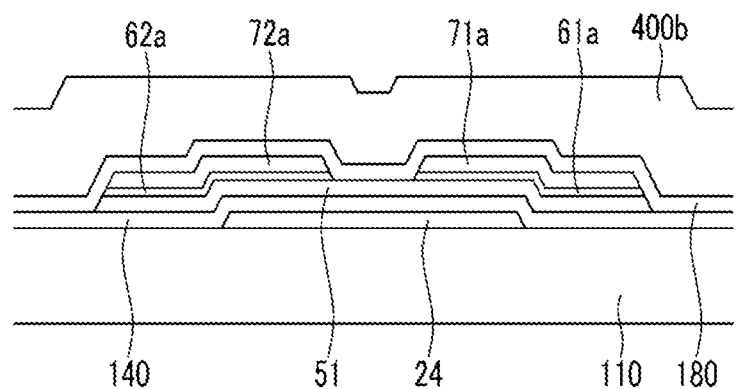
Figure 25:
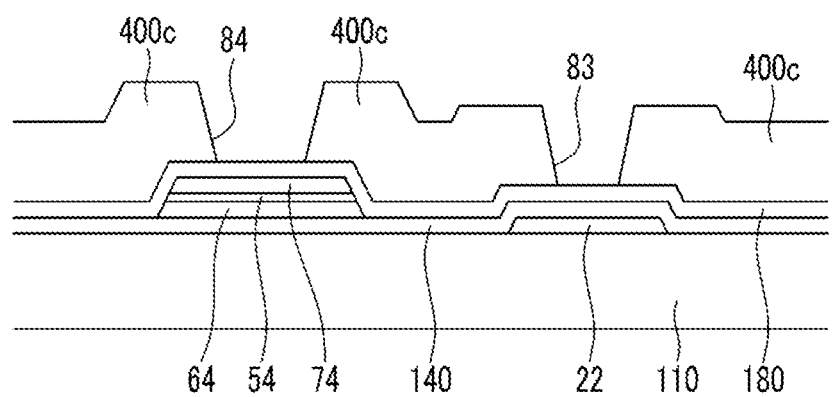
Figure 26:
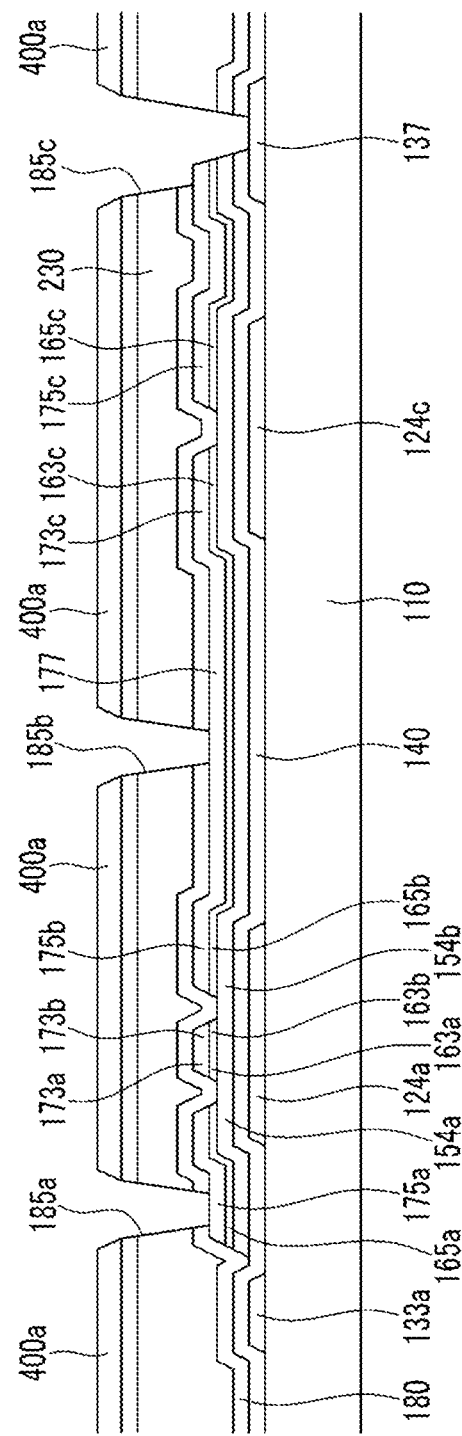
Figure 27:
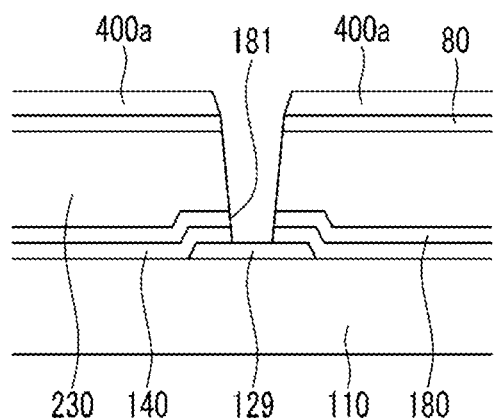
Figure 28:
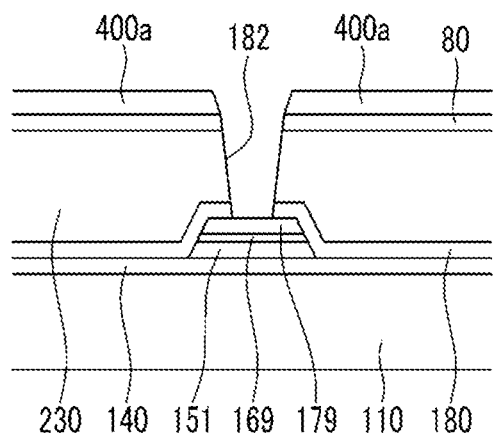
Figure 29:
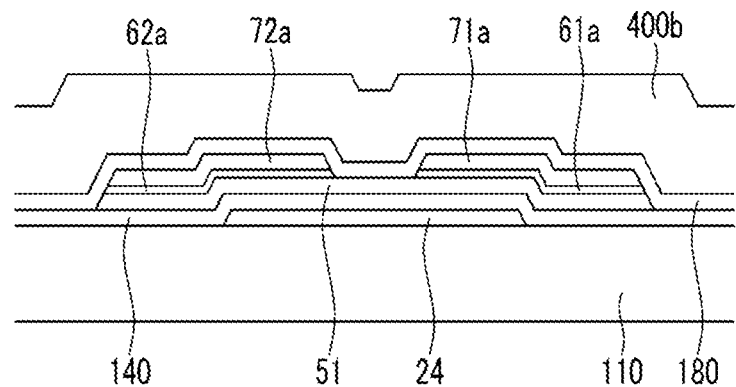
Figure 30:
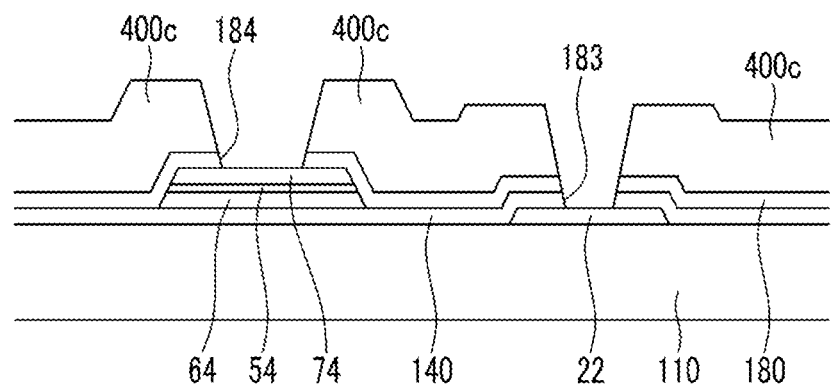
Figure 31:
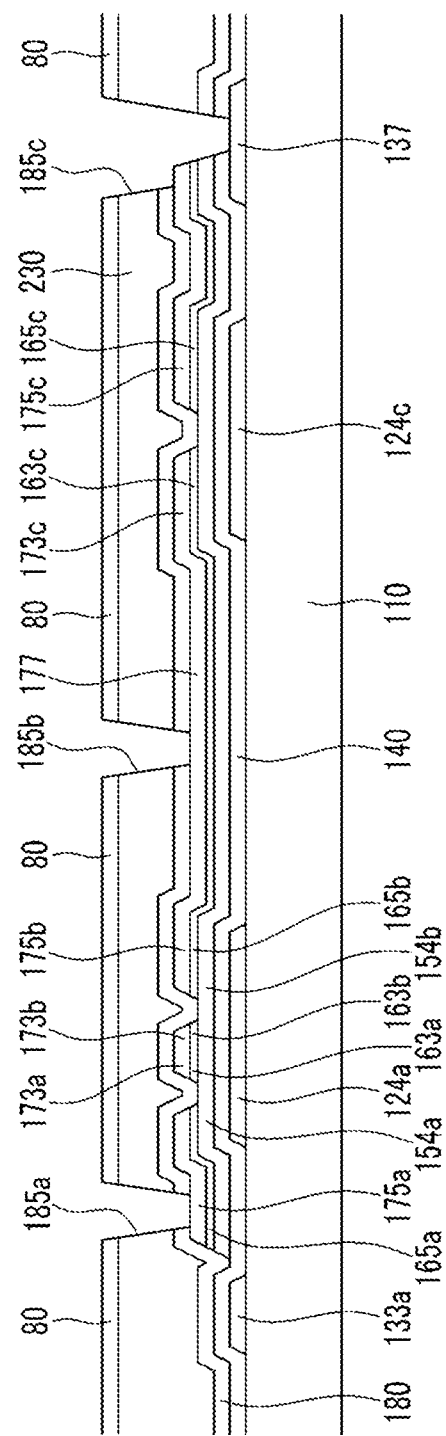
Figure 32:
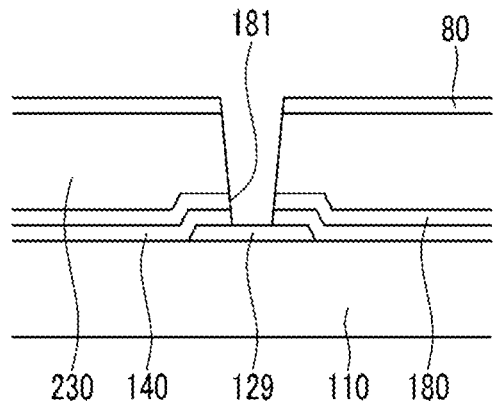
Figure 33:
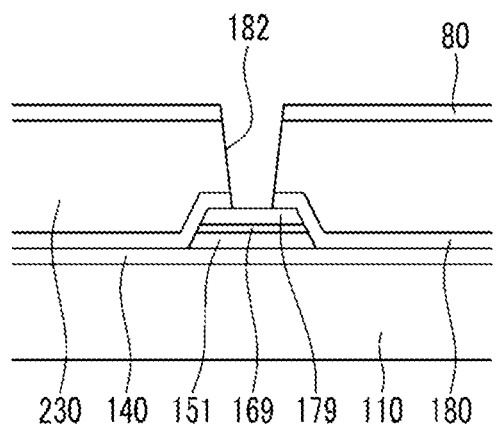
Figure 34:
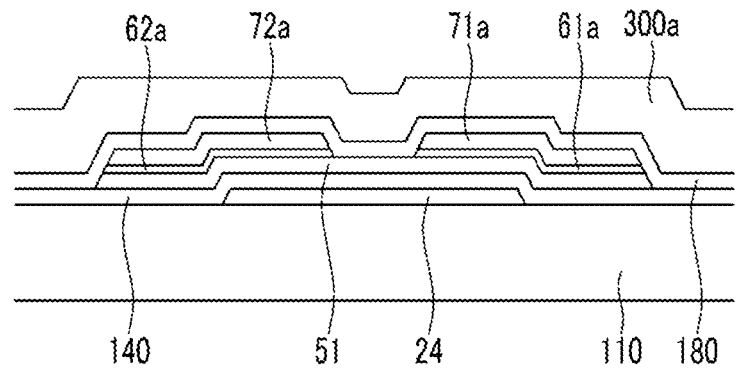
Figure 35:
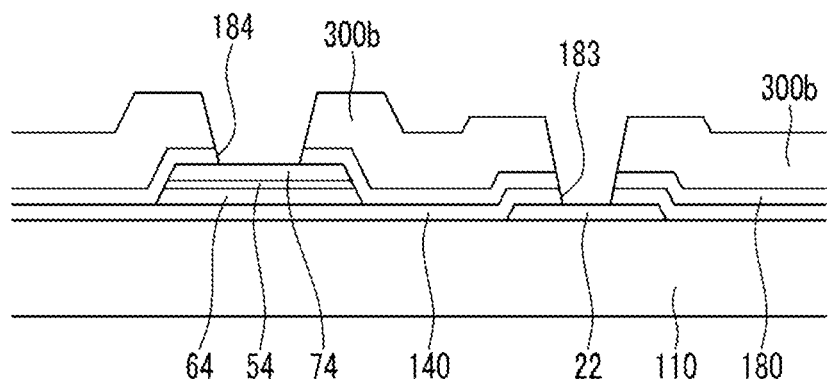

Referring to FIGS. 14 and 15, the peripheral area PA is described.

As illustrated in FIGS. 14 and 15, a driving control signal line 21 including the driving control electrode 24 and a first driving signal transfer line 22 are formed on the insulation substrate 110. The gate insulating layer 140 is laminated on the driving control signal line 21 and the first driving signal transfer line 22, and the driving semiconductor 51 and the dummy semiconductor 54, the driving ohmic contacts 61a and 61b and the dummy ohmic contact 64, and the driving input signal line 71 including the driving input electrode 71a, the driving output signal line 72 including the driving output electrode 72a and the second driving signal transfer lines 73 and 74 are formed on the gate insulating layer 140.

Next, the passivation layer 180 is laminated on the driving input signal line 71, the driving output signal line 72, and the second driving signal transfer lines 73 and 74 and the gate insulating layer 140.

In this example, the color filter 230 and the overcoat 80 are not formed in the peripheral area PA.

Next, as illustrated in FIGS. 16 to 20, a photosensitive film 400 is laminated, exposed, and developed on the overcoat 80 of the display area DA and the passivation layer 180 of the peripheral area PA, and as illustrated in FIGS. 21 to 25, a first photosensitive film pattern 400a is formed on the overcoat 80 of the display area DA, and a second photosensitive film pattern 400b and a third photosensitive film pattern 400c are formed on the passivation layer 180 of the peripheral area PA. In this example, the photosensitive film patterns 400a, 400b, and 400c are not positioned at a position where contact holes 181, 182, 183, 184, 185a, 185b, and 185c are formed. Further, a thickness of the first photosensitive film pattern 400a positioned in the display area DA is smaller than thicknesses of the second photosensitive film pattern 400b and the third photosensitive film pattern 400c positioned in the peripheral area PA.

The thicknesses of the second photosensitive film pattern 400b and the third photosensitive film pattern 400c which are positioned in the peripheral area PA may be the same as each other, but the third photosensitive film pattern 400c has openings 83 and 84 exposing a region that corresponds to a position where a sixth contact hole 183 and a seventh contact hole 184 are positioned.

Next, as illustrated in FIGS. 26 to 30, by using the first photosensitive film pattern 400a and the third photosensitive film pattern 400c as an etching mask, the overcoat 80 of the display area DA, the color filter 230, the passivation layer 180 and the gate insulating layer 140, and the passivation layer 180 and the gate insulating layer 140 of the peripheral area PA are etched to form the contact holes 181, 182, 183, 184, 185a, 185b, and 185c. In the display area DA, the first drain electrode 175a, the second drain electrode 175b, a part of the reference electrode 137 and a part of the third drain electrode 175c, the gate pad 129, and the first contact hole 185a, the second contact hole 185b, the third contact hole 185c, the fourth contact hole 181, and the fifth contact hole 182 which expose the data pad 179 are formed. In the peripheral area PA, the sixth contact hole 183 exposing a part of the first driving signal transfer line 22 and the is seventh contact hole 184 exposing a part of the second driving signal transfer lines 73 and 74 are formed.

In this example, unlike the display area DA, in the peripheral area PA, since only the passivation layer 180 and the gate insulating layer 140 are positioned below the third photosensitive film pattern 400c and thus the sixth contact hole 183 and the seventh contact hole 184 are formed only in the passivation layer 180 and the gate insulating layer 140, heights of the sixth contact hole 183 and the seventh contact hole 184 formed in the peripheral area PA are smaller than the height of the contact hole formed in the display area DA. Further, an etching time for forming the sixth contact hole 183 and the seventh contact hole 184 is reduced, and as a result, widths of the sixth contact hole 183 and the seventh contact hole 184 may be decreased.

Next, as illustrated in FIGS. 31 to 35, the first photosensitive film pattern 400a is removed by a method such as mechanical planarization and the heights of the second photosensitive film pattern 400b and the third photosensitive film pattern 400c are decreased to complete the first photosensitive film 300a and the second photosensitive film 300b positioned in the peripheral area PA.

Next, as illustrated in FIGS. 2, 3, 9, and 10, the pixel electrode 191, the first connecting member 193, the second connecting member 91, and the third connecting member 92 are formed in the display area DA, and the fourth connecting member 93 is formed in the peripheral area PA.

As such, according to the manufacturing method of the thin film transistor array panel according to the exemplary embodiments of the present invention, the color filter 230 and the overcoat 80 are formed only in the display area DA, but are not formed in the peripheral area PA. Further, in the display area DA and the peripheral area PA, the contact holes are formed by is using one light mask, the photosensitive pattern of the display area DA are removed, and the photosensitive pattern of the peripheral area PA partially remains, and as a result, the driving transistor and the driving signal transfer line of the peripheral area PA are covered and protected by the photosensitive film and simultaneously, the heights and the widths of the contact holes of the peripheral area PA are decreased to protect the driving transistor and the driving signal transfer line from external moisture or static electricity. Further, in the process of forming the contact hole, the photosensitive film remains in the peripheral area PA to increase the height of the peripheral area PA, and as a result, heights of the sealant S and a spacer formed in the peripheral area PA may be decreased and thus manufacturing costs may be reduced.

Figure 36:
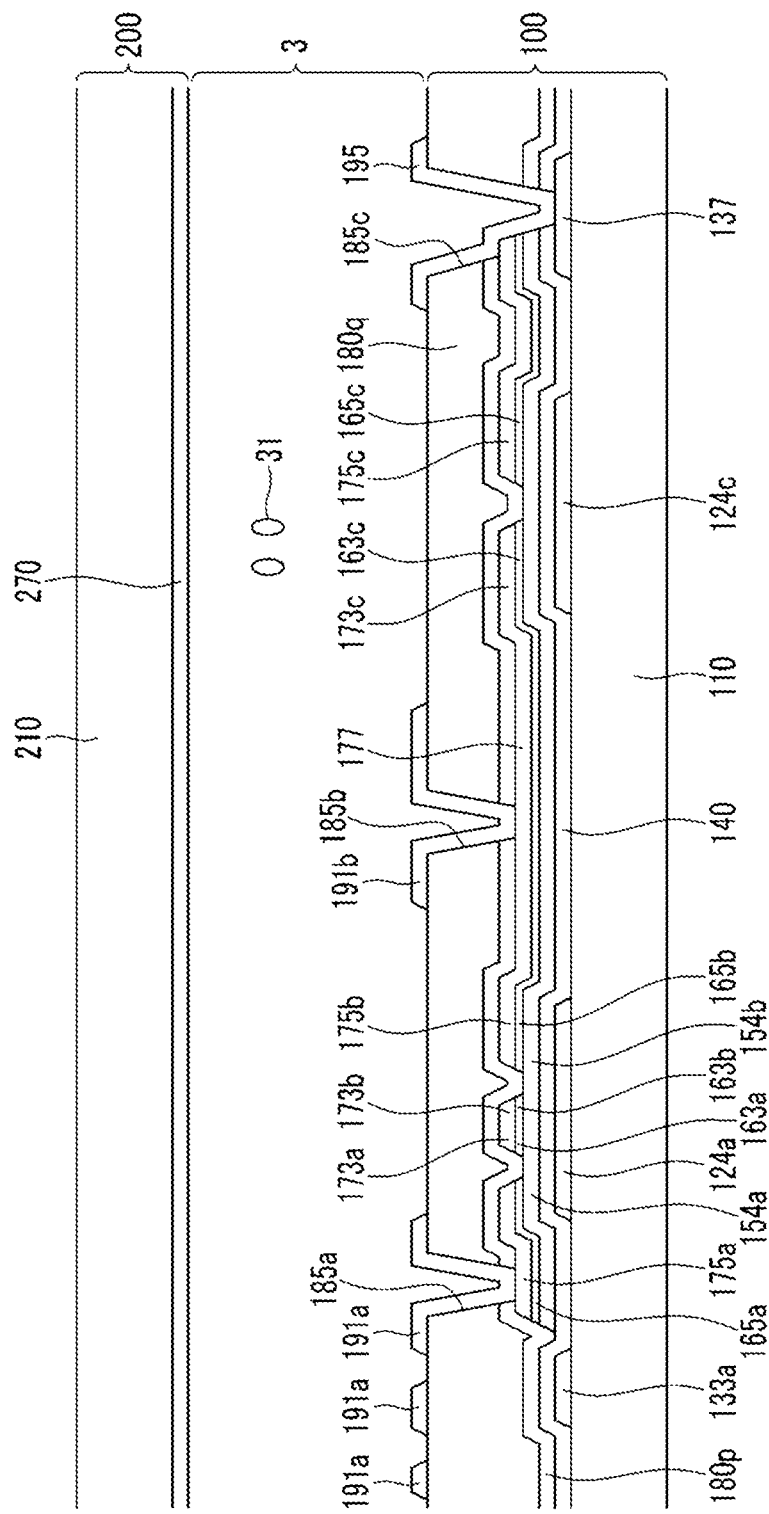
FIG. 36 is a cross-sectional view illustrating a thin film transistor array panel taken along line III-III of FIG. 2 according to exemplary embodiments of the present invention.
Figure 37:
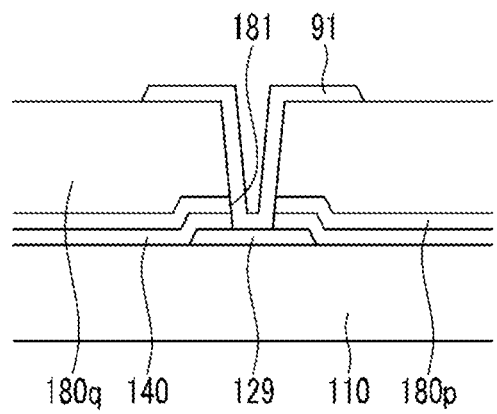
FIG. 37 is a cross-sectional view illustrating the thin film transistor array panel taken along line V-V of FIG. 2 according to exemplary embodiments of the present invention.
Figure 38:
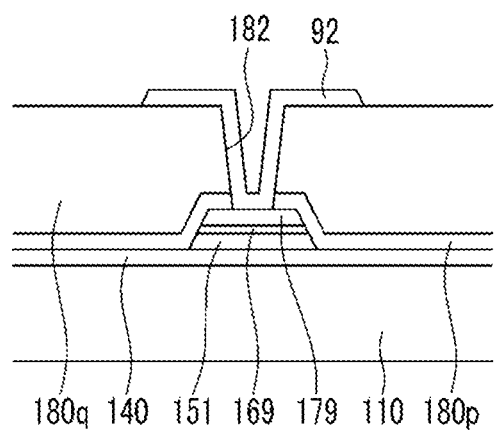
FIG. 38 is a cross-sectional view illustrating the thin film transistor array panel taken along line VI-VI of FIG. 2 according to exemplary embodiments of the present invention.
Figure 39:
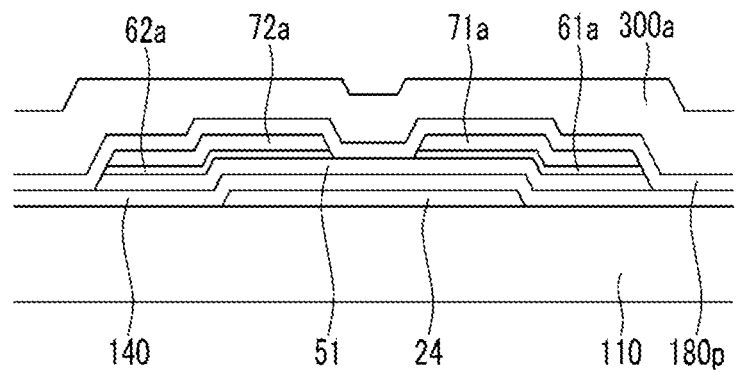
FIG. 39 is a cross-sectional view illustrating the thin film transistor array panel taken along line VIII-VIII of FIG. 7 according to exemplary embodiments of the present invention.
Figure 40:
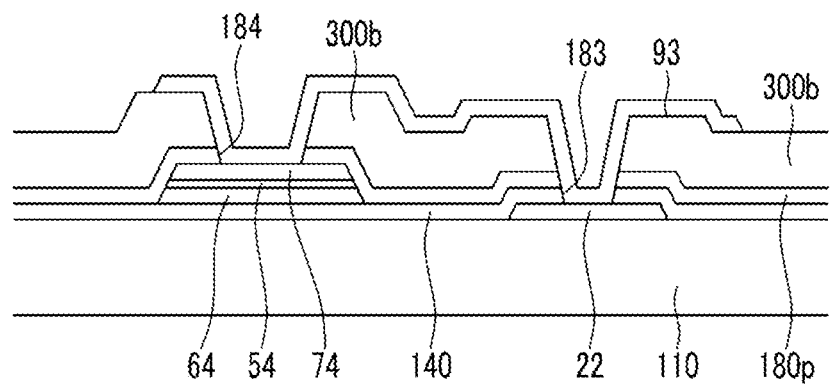
FIG. 40 is a cross-sectional view illustrating the thin film transistor array panel taken along line X-X of FIG. 9 according to exemplary embodiments of the present invention.
Figure 41:
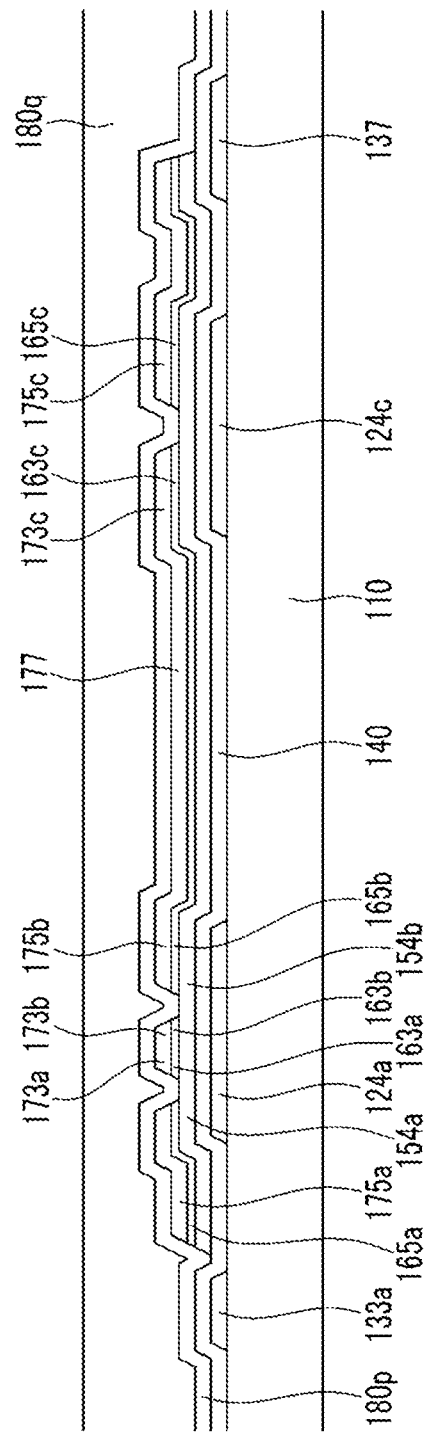
FIGS. 41 to 65 are cross-sectional views sequentially illustrating a manufacturing method of the thin film transistor array panel according to exemplary embodiments of the present invention.
Figure 42:
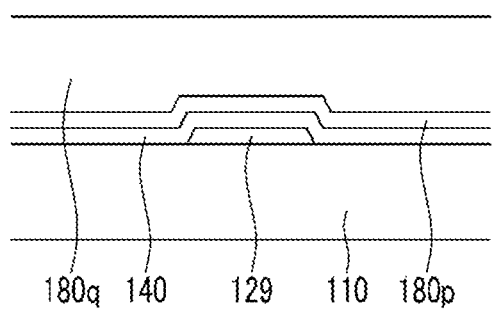
Figure 43:
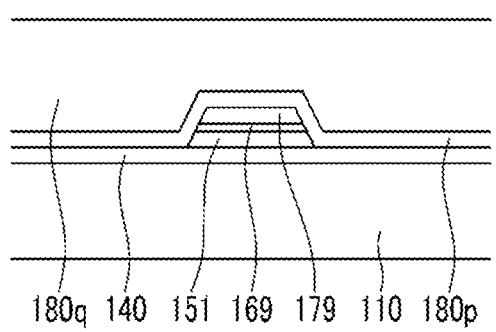
Figure 44:
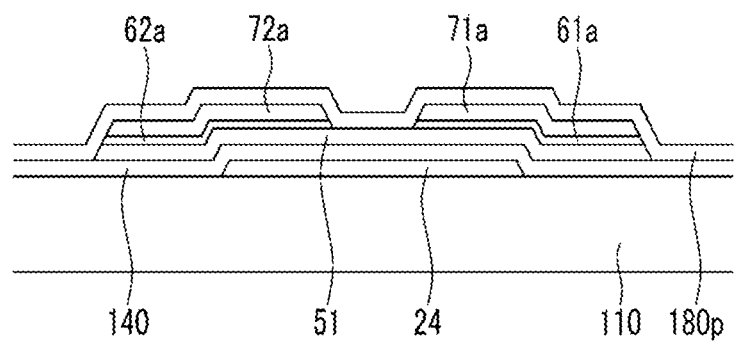
Figure 45:
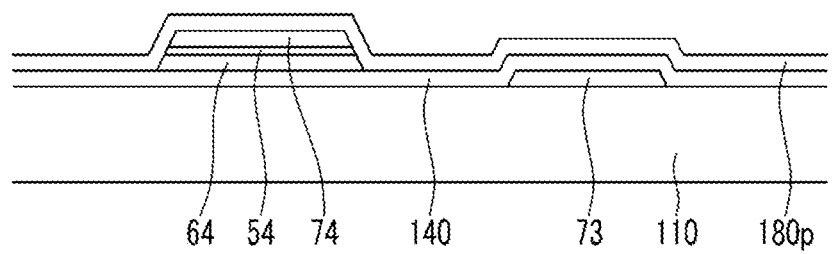
Figure 46:
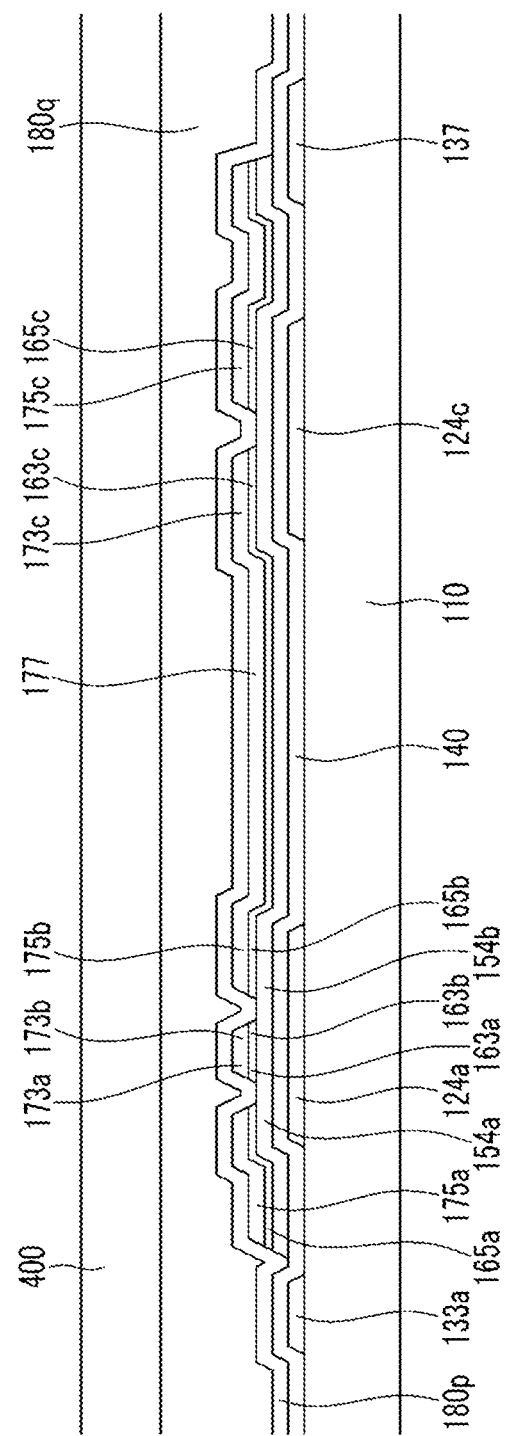
Figure 47:
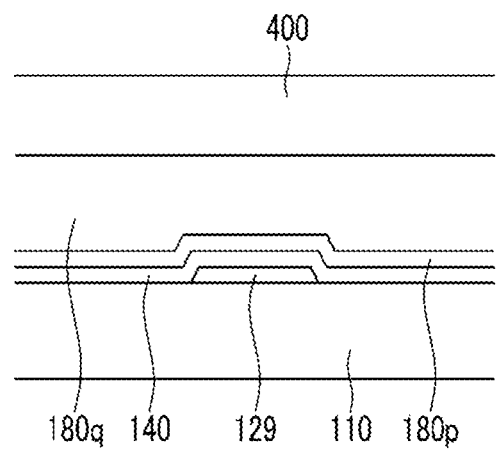
Figure 48:
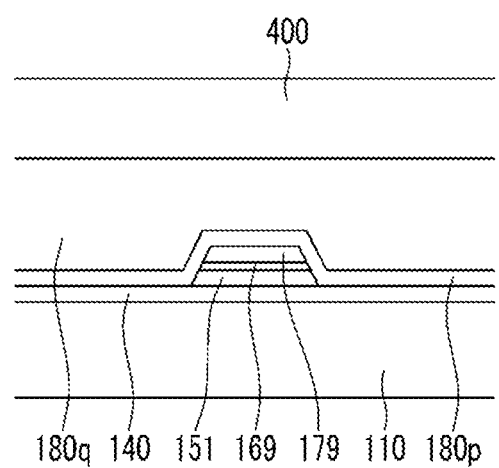
Figure 49:
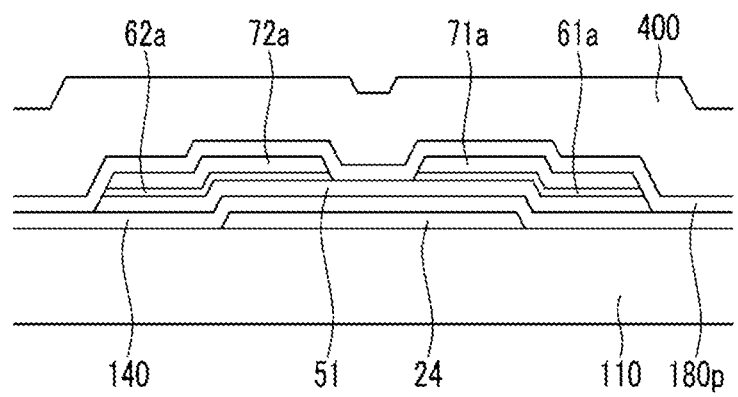
Figure 50:
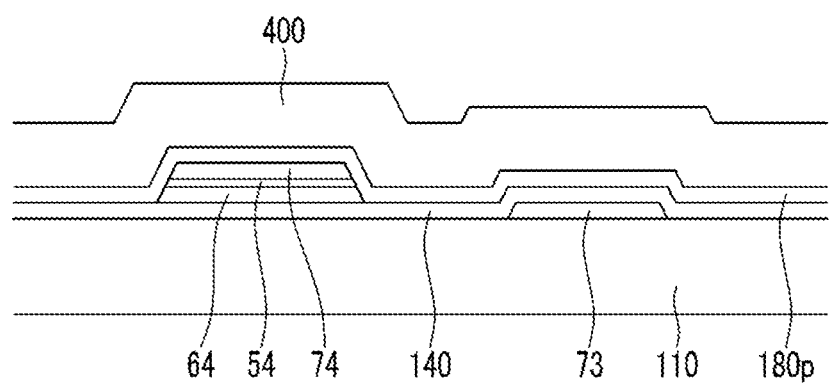
Figure 51:
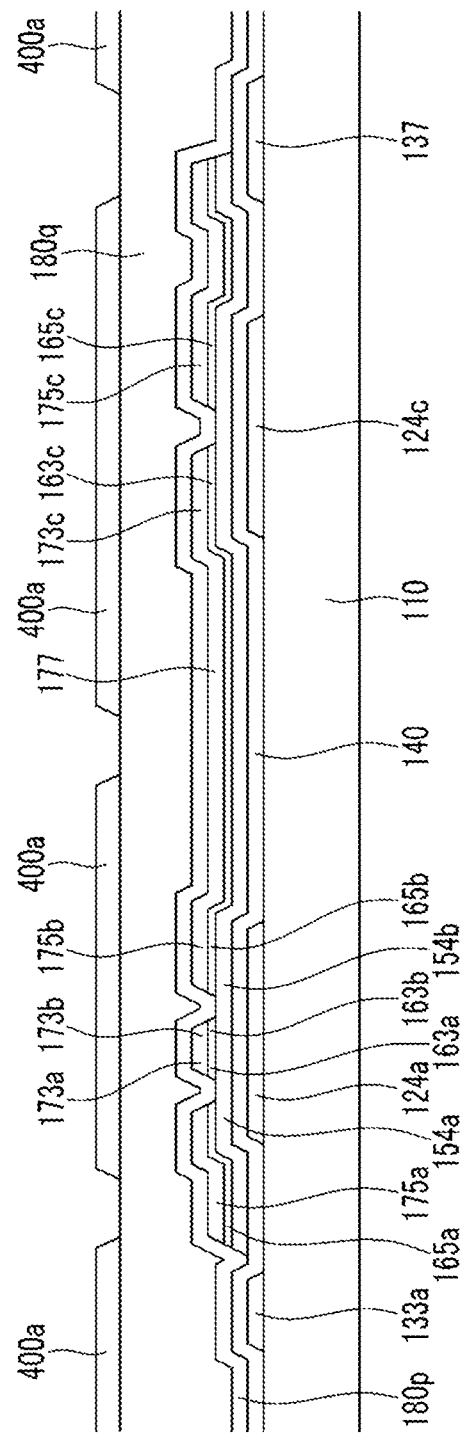
Figure 52:
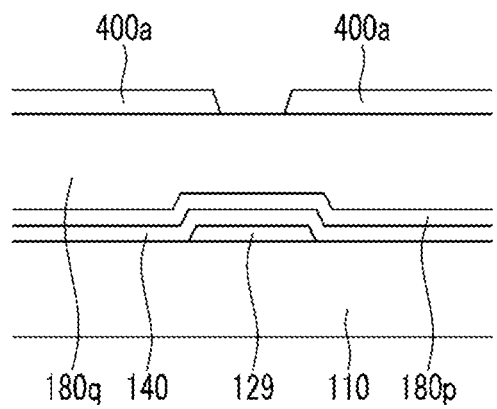
Figure 53:
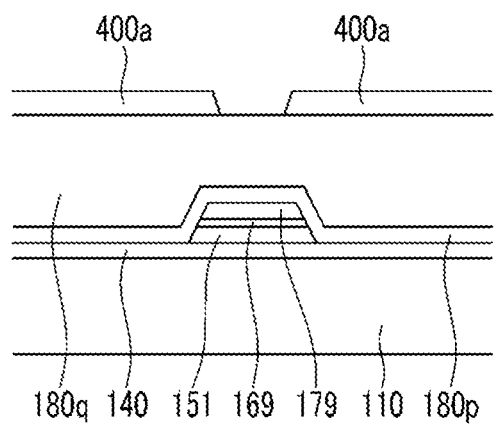
Figure 54:
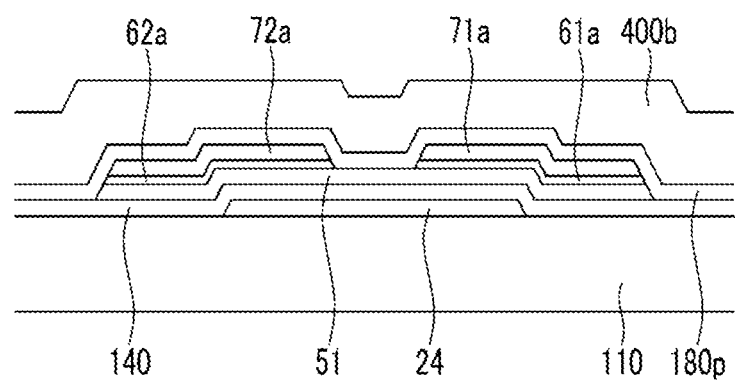
Figure 55:
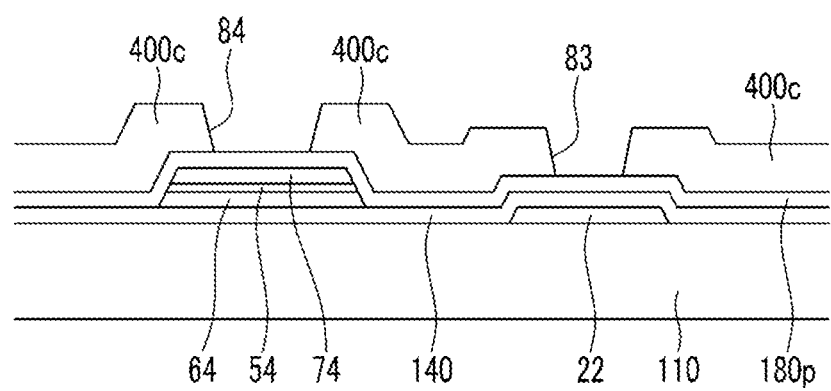
Figure 56:
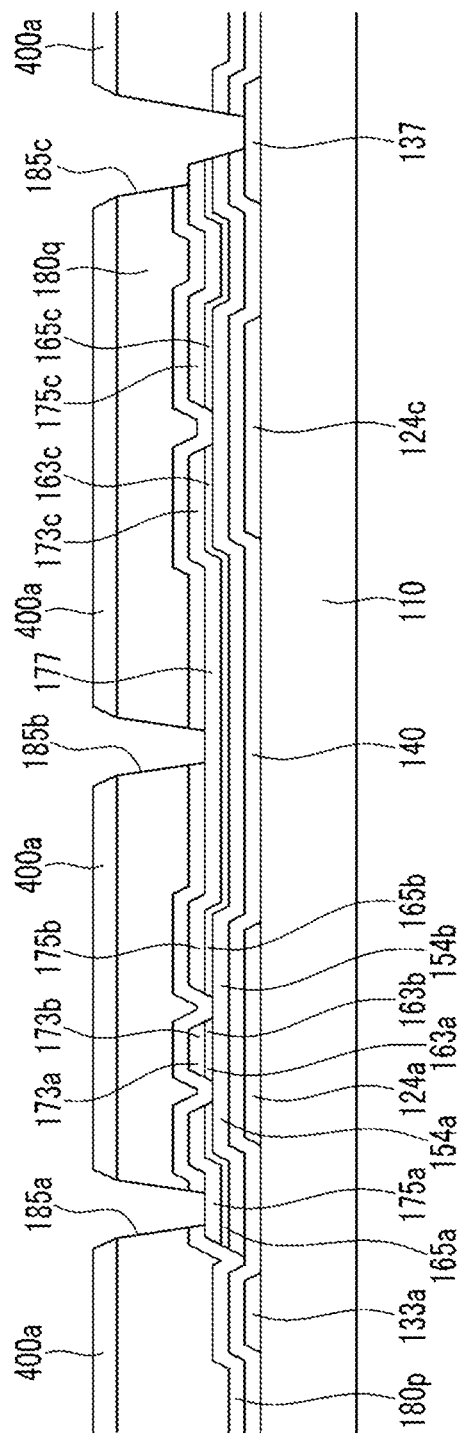
Figure 57:
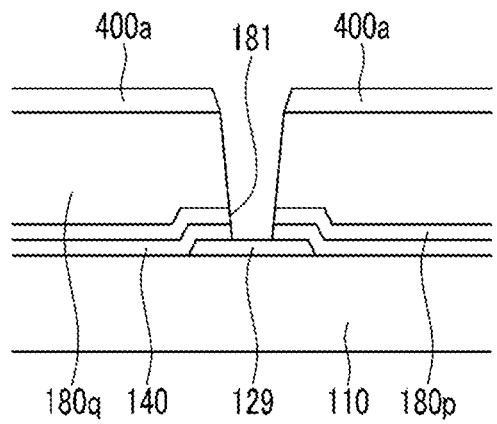
Figure 58:
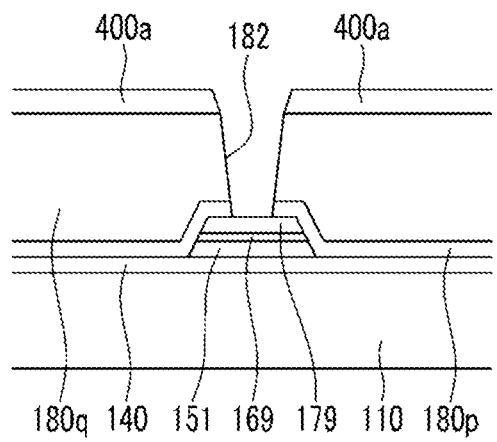
Figure 59:
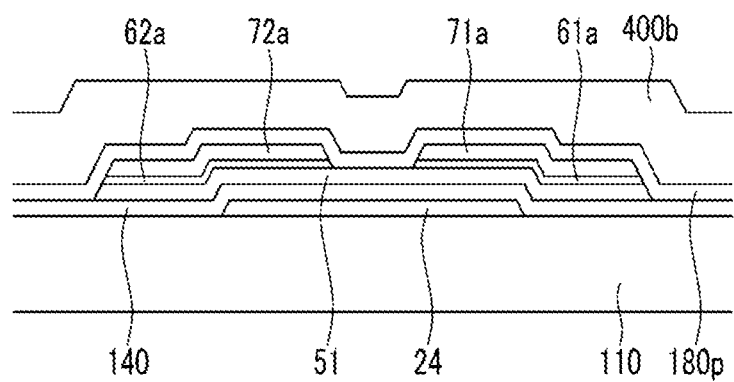
Figure 60:
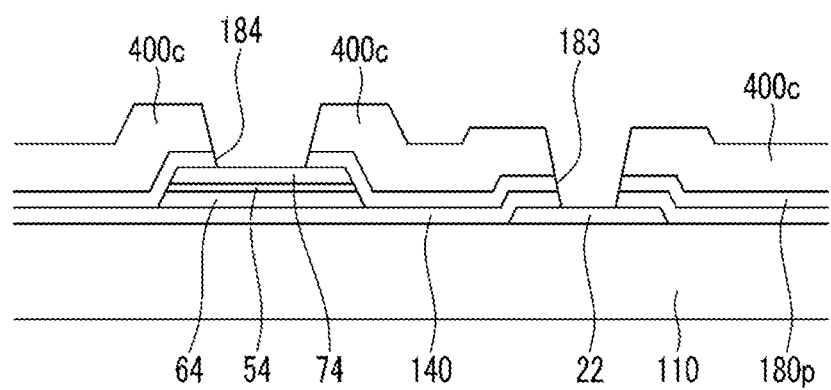
Figure 61:
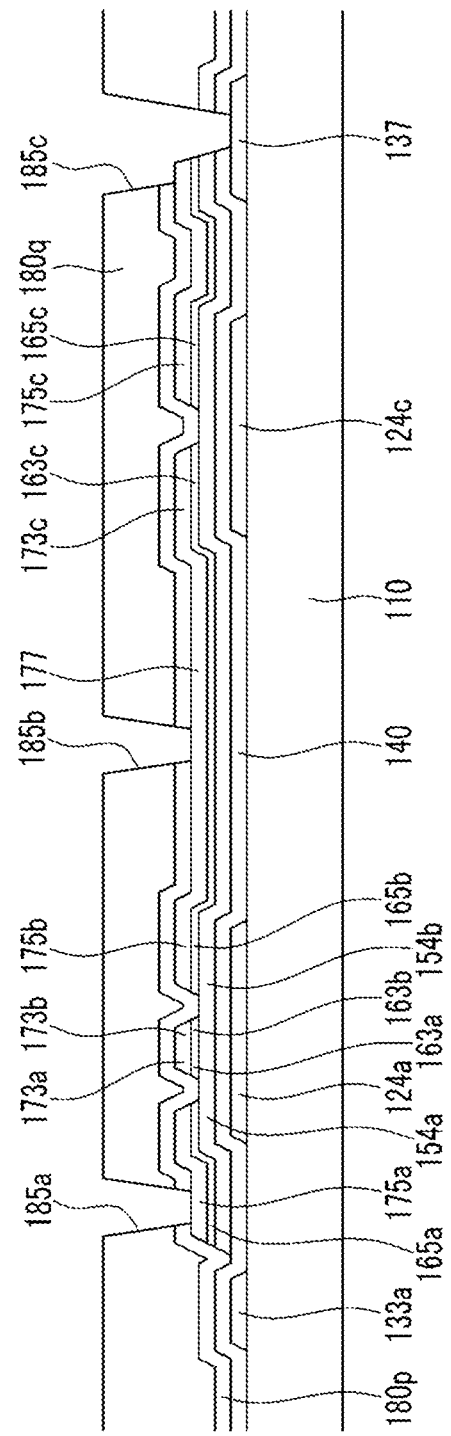
Figure 62:
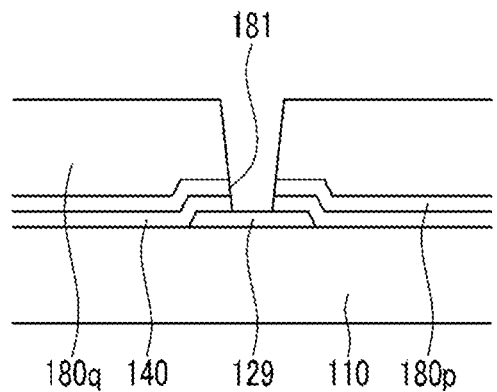
Figure 63:
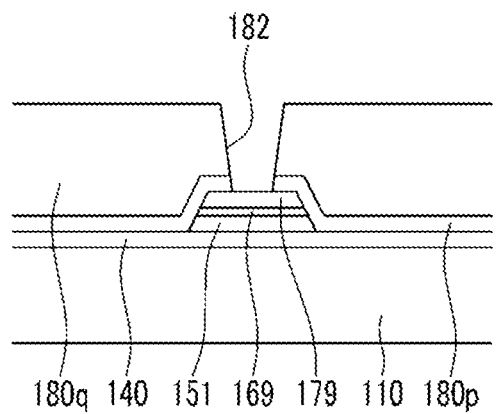
Figure 64:
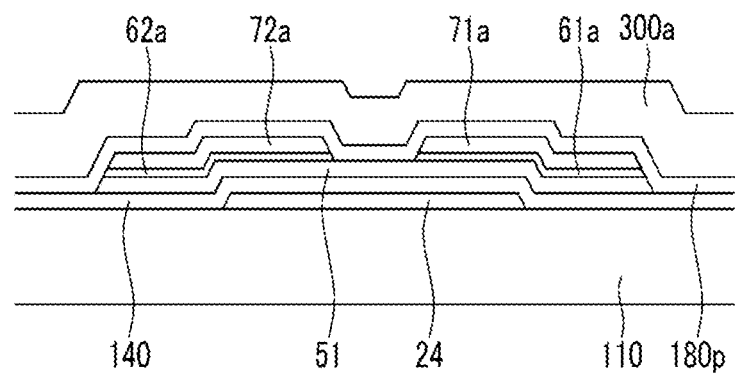
Figure 65:
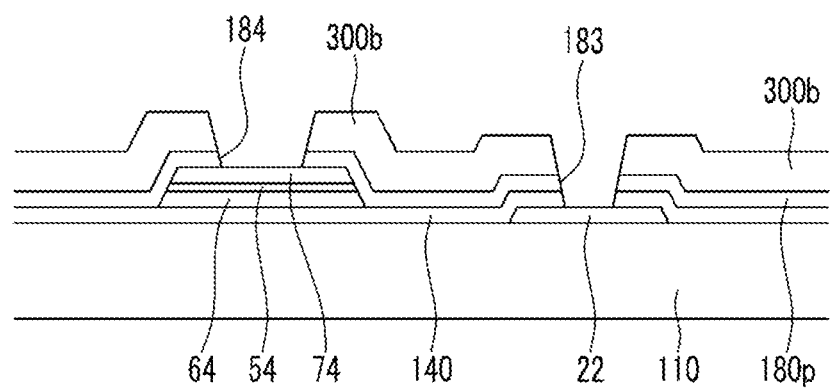

Then, a thin film transistor array panel according to exemplary embodiments of the present invention is described with reference to FIGS. 36 to 40, in addition to FIGS. 2, 7, and 9. FIG. 36 is a cross-sectional view illustrating a thin film transistor array panel taken along line III-III of FIG. 2 according to exemplary embodiments of the present invention. FIG. 37 is a cross-sectional view illustrating the thin film transistor array panel taken along line V-V of FIG. 2 according to exemplary embodiments of the present invention. FIG. 38 is a cross-sectional view illustrating the thin film transistor array panel taken along line VI-VI of FIG. 2 according to exemplary embodiments of the present invention. FIG. 39 is a cross-sectional view illustrating the thin film transistor array panel taken along line VIII-VIII of FIG. 7 according to exemplary embodiments of the present invention. FIG. 40 is a cross-sectional view illustrating the thin film transistor array panel taken along line X-X of FIG. 9 according to exemplary embodiments of the present invention.

Referring to FIGS. 36 to 40 in addition to FIGS. 1, 2, 7, and 9, the thin film transistor array panel according to the exemplary embodiments is similar to the thin film transistor array panel according to the exemplary embodiments described with reference to FIGS. 2 to 10. The detailed description of like constituent elements is omitted to avoid unnecessarily obscuring the present invention.

On the insulation substrate 110, a gate conductor 121, 124a, 124b, 124c, 129, 131, 21, 24, and 22 including the gate line 121 and the divided reference voltage line 131, the driving control signal line 21, and the first driving signal transfer line 22 are formed.

The gate insulating layer 140 is formed on the gate conductor 121, 124a, 124b, 124c, 129, 131, 135, 136, 137, 138, 139, 21, 24, and 22.

On the gate insulating layer 140, the semiconductors 154a, 154b, and 154c, the driving semiconductor 51 and the dummy semiconductor 54, the ohmic contacts 163a, 165a, 163b, 165b, 163c, 165c, and 169, and the driving ohmic contacts 61a and 61b and the dummy ohmic contact 64 are formed. In addition, the data conductor 171, 173a, 173b, 173b, 173c, 175a, 175b, 175c, 71, 71a, 72, 72a, 73, and 74 that includes the plurality of data lines 171 including the first source electrode 173a and the second source electrode 173b, the first drain electrode 175a, the second drain electrode 175b, the third source electrode 173a and the third drain electrode 175c, the driving input signal line 71 including the driving input electrode 71a, the driving output signal line 72 including the driving output electrode 72a, and the second driving signal transfer lines 73 and 74 is formed.

A first passivation layer 180p is formed on the data conductor 171, 173a, 173b, 173b, 173c, 175a, 175b, 175c, 71, 71a, 72, 72a, 73, and 74.

A second passivation layer 180q is formed on the first passivation layer 180p of the display area DA. The first passivation layer 180p may be an inorganic insulating layer, and the second passivation layer 180q may be an organic insulator.

The second passivation layer 180q is not positioned in the peripheral area PA and thus the heights of the sixth contact hole 183 and the seventh contact hole 184 formed in the peripheral area PA are decreased, and the widths are decreased.

In the first passivation layer 180p and the second passivation layer 180q, the first contact hole 185a and the second contact hole 185b exposing the first drain electrode 175a and the second drain electrode 175b, and the fifth contact hole 182 exposing the data pad 179 are formed.

In the first passivation layer 180p and the second passivation layer 180q, and the gate insulating layer 140, the third contact hole 185c exposing a part of the reference electrode 137 and a part of the third drain electrode 175c, and the fourth contact hole 181 exposing the gate pad 129 are formed.

The seventh contact hole 184 exposing a part of the second driving signal transfer lines 73 and 74 is formed in the first passivation layer 180p. The sixth contact hole 183 exposing a part of the first driving signal transfer line 22 is formed in the first passivation layer 180p and the gate insulating layer 140.

On the first passivation layer 180p of the peripheral area PA, the first photosensitive film 300a and the second photosensitive film 300b are positioned. The second photosensitive film 300b has an opening corresponding to a position where the sixth contact hole 183 and the seventh contact hole 184 are formed, the sixth contact hole 183 and the seventh contact hole 184 are arranged with the opening of the second photosensitive film 300b, and the first passivation layer 180 and gate insulating layer 140 are etched and formed by using the second photosensitive film 300b having the opening as an etching mask.

The pixel electrode 191 is formed on the second passivation layer 180p, the first is connecting member 193 is formed in the third contact hole 185c, and the second connecting member 91 and the third connecting member 92 are formed on the fourth contact hole 181 and the fifth contact hole 182.

The fourth connecting member 93 is formed on the sixth contact hole 183 and the seventh contact hole 184.

However, unlike the thin film transistor array panel according to the exemplary embodiments described above with reference to FIGS. 2 to 10, the thin film transistor array panel according to the exemplary embodiments does not include the color filter 230 and the overcoat 80, but includes the first passivation layer 180p made of an inorganic insulating layer and the second passivation layer 180q made of an organic insulating layer.

In the thin film transistor according to the exemplarys embodiment, the first photosensitive film 300a and the second photosensitive film 300b are positioned in the peripheral area PA of the thin film transistor array panel to protect a driving circuit unit including the driving transistor and the driving signal transfer line from moisture or static electricity. Further, the sixth contact hole 183 and the seventh contact hole 184 exposing the driving signal transfer lines 22, 73, and 74 are formed by etching the first passivation layer 180p and the gate insulating layer 140 by using the second photosensitive film 300b as an etching mask, and as a result, since the second passivation layer 180q which has a relatively thick thickness is not etched together, a height of the contact hole may be decreased and thus a width of the contact hole is decreased. Accordingly, an inflow amount of moisture or static electricity through the contact hole is decreased. Further, in the process of forming the contact hole, the photosensitive film remains in the peripheral area PA to increase the height of the peripheral area PA, and as a result, heights of the sealant S and a spacer formed in the peripheral area PA may be decreased and thus is manufacturing costs may be reduced.

Many features of the thin film transistor according to the exemplary embodiments described with reference to FIGS. 2 to 10 all may be applied to the thin film transistor array panel according to the exemplary embodiments.

Then, a manufacturing method of the thin film transistor array panel according to exemplary embodiments of the present invention is described with reference to FIGS. 41 to 65, in addition to FIGS. 2, 7, and 9. FIGS. 41 to 65 are cross-sectional views sequentially illustrating a manufacturing method of the thin film transistor array panel according to exemplary embodiments of the present invention, which are cross-sectional views taken along lines III-III, V-V, and VI-VI of FIG. 2, line VIII-VIII of FIG. 7, and line X-X of FIG. 9.

Referring to FIGS. 41 to 65, the manufacturing method of the thin film transistor according to the exemplary embodiments is similar to the manufacturing method of the thin film transistor array panel according to the exemplary embodiments described with reference to FIGS. 11 to 35.

Referring to FIGS. 41 to 45, on the insulation substrate 110, the gate conductor 121, 124a, 124b, 124c, 129, 131, 21, 24, and 22 including the gate line 121 and the divided reference voltage line 131, the driving control signal line 21, and the first driving signal transfer line 22 is formed. The gate insulating layer 140 is formed on the gate conductor 121, 124a, 124b, 124c, 129, 131, 135, 136, 137, 138, 139, 21, 24, and 22. On the gate insulating layer 140, the data conductor 171, 173a, 173b, 173b, 173c, 175a, 175b, 175c, 71, 71a, 72, 72a, 73, and 74 that includes the plurality of data lines 171 including the semiconductors 154a, 154b, and 154c, driving semiconductor 51 and the dummy semiconductor 54, the ohmic contacts 163a, 165a, 163b, 165b, 163c, 165c, and 169, the driving ohmic contacts 61a and 61b and the dummy ohmic contact 64, and the first source electrode 173a and the second source electrode 173b, the driving input signal line 71 including the first drain electrode 175a, the second drain electrode 175b, the third source electrode 173a and the third drain electrode 175c, the driving input signal line 71 including the driving input electrode 71a, the driving output signal line 72 including the driving output electrode 72a and the second driving signal transfer lines 73 and 74 is formed.

The first passivation layer 180*p* is laminated on the data conductor 171, 173*a*, 173*b*, 173*b*, 173*c*, 175*a*, 175*b*, 175*c*, 71, 71*a*, 72, 72*a*, 73, and 74.

In addition, the second passivation layer 180*q* is laminated on the first passivation layer 180*p* of the display area DA. The second passivation layer 180*q* is not positioned in the peripheral area PA.

As illustrated in FIGS. 46 to 50, the photosensitive film 400 is coated on the second passivation layer 180*q* of the display area DA and the first passivation layer 180*p* of the peripheral area PA.

By exposing and developing the photosensitive film 400, as illustrated in FIGS. 51 to 55, the first photosensitive film pattern 400*a* is formed on the second passivation layer 180*q* of the display area DA, and the second photosensitive film pattern 400*b* and the third photosensitive film pattern 400*c* are formed on the first passivation layer 180*p* of the peripheral area PA. In this example, the photosensitive film patterns 400*a*, 400*b*, and 400*c* are not positioned at the position where the contact holes 181, 182, 183, 184, 185*a*, 185*b*, and 185*c* are formed. Further, a thickness of the first photosensitive film pattern 400*a* positioned in the display area DA is smaller than thicknesses of the second photosensitive film pattern 400*b* and the third photosensitive film pattern 400*c* positioned in the peripheral area PA.

The thicknesses of the second photosensitive film pattern 400*b* and the third is photosensitive film pattern 400*c* which are positioned in the peripheral area PA may be the same as each other, but the third photosensitive film pattern 400*c* has openings 83 and 84 exposing a region that corresponds to a position where a sixth contact hole 183 and a seventh contact hole 184 are positioned.

Next, as illustrated in FIGS. 56 to 60, by using the first photosensitive film pattern 400*a* and the third photosensitive film pattern 400*c* as an etching mask, the second passivation layer 180*q* of the display area DA, the first passivation layer 180*p* and gate insulating layer 140, and the first passivation layer 180*p* and the gate insulating layer 140 of the peripheral area PA are etched to form the contact holes 181, 182, 183, 184, 185*a*, 185*b*, and 185*c*.

Unlike the display area DA, in the peripheral area PA, since only the first passivation layer 180*p* and the gate insulating layer 140 are positioned below the third photosensitive film pattern 400*c* and thus the sixth contact hole 183 and the seventh contact hole 184 are formed only in the first passivation layer 180*p* and the gate insulating layer 140, the heights of the sixth contact hole 183 and the seventh contact hole 184 formed in the peripheral area PA are smaller than the height of the contact hole formed in the display area DA. Further, an etching time for forming the sixth contact hole 183 and the seventh contact hole 184 is reduced, and as a result, widths of the sixth contact hole 183 and the seventh contact hole 184 may be decreased.

Next, as illustrated in FIGS. 61 to 65, the first photosensitive film 300*a* and the second photosensitive film 300*b* positioned in the peripheral area PA are completed by removing the first photosensitive film pattern 400*a* and decreasing the heights of the second photosensitive film pattern 400*b* and the third photosensitive film pattern 400*c*.

As illustrated in FIGS. 2, 3, 9, and 10, the pixel electrode 191, the first connecting member 193, the second connecting member 91, and the third connecting member 92 are formed in the display area DA, and the fourth connecting member 93 is formed in the peripheral area PA.

As such, according to the manufacturing method of the thin film transistor array panel according to the exemplary embodiments of the present invention, the second passivation layer 180*q* made of an organic insulating layer is formed only in the display area DA, but is not formed in the peripheral area PA. Further, in the display area DA and the peripheral area PA, the contact holes are formed by using one light mask, the photosensitive pattern of the display area DA is removed, and the photosensitive pattern of the peripheral area PA partially remains, and as a result, the driving transistor and the driving signal transfer line of the peripheral area PA are covered and protected by the photosensitive film and simultaneously, the heights and the widths of the contact holes of the peripheral area PA are decreased to protect the driving transistor and the driving signal transfer line from external moisture or static electricity. Further, in the process of forming the contact hole, the photosensitive film remains in the peripheral area PA to increase the height of the peripheral area PA, and as a result, heights of the sealant S and a spacer formed in the peripheral area PA may be decreased and thus manufacturing costs may be reduced.

Many features of the manufacturing method of the thin film transistor according to the exemplary embodiments described above with reference to FIGS. 11 to 35 all may be applied to the manufacturing method of the thin film transistor array panel according to the exemplary embodiments.

Figure 66:
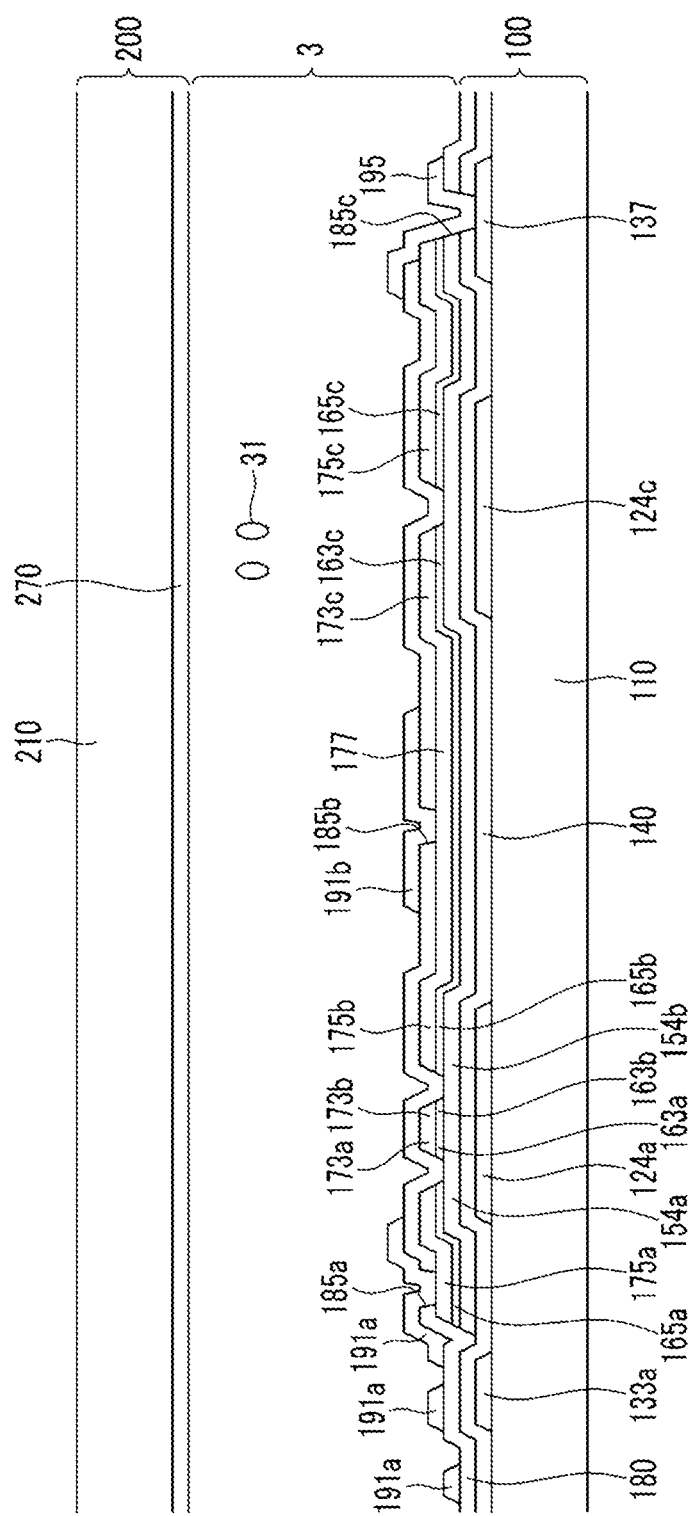
FIG. 66 is a cross-sectional view illustrating a thin film transistor array panel taken along line III-III of FIG. 2 according to exemplary embodiments of the present invention.
Figure 67:
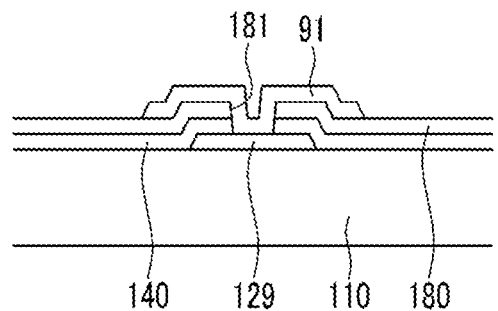
FIG. 67 is a cross-sectional view illustrating the thin film transistor array panel is taken along line V-V of FIG. 2 according to exemplary embodiments of the present invention.
Figure 68:
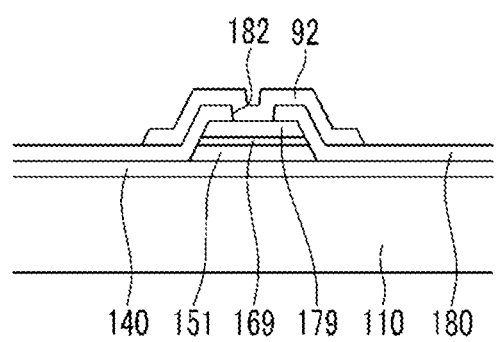
FIG. 68 is a cross-sectional view illustrating the thin film transistor array panel taken along line VI-VI of FIG. 2 according to exemplary embodiments of the present invention.
Figure 69:
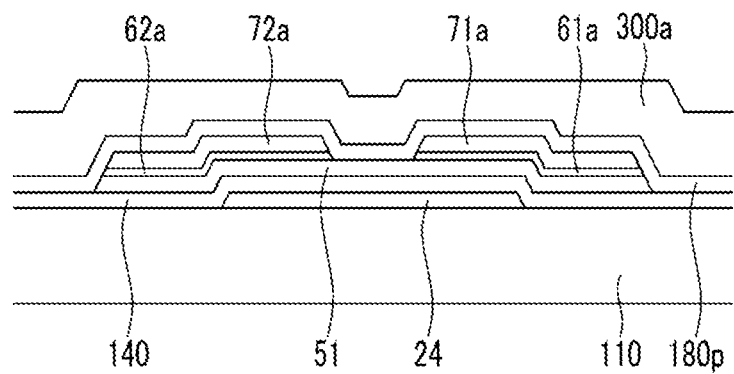
FIG. 69 is a cross-sectional view illustrating the thin film transistor array panel taken along line VIII-VIII of FIG. 7 according to exemplary embodiments of the present invention.
Figure 70:
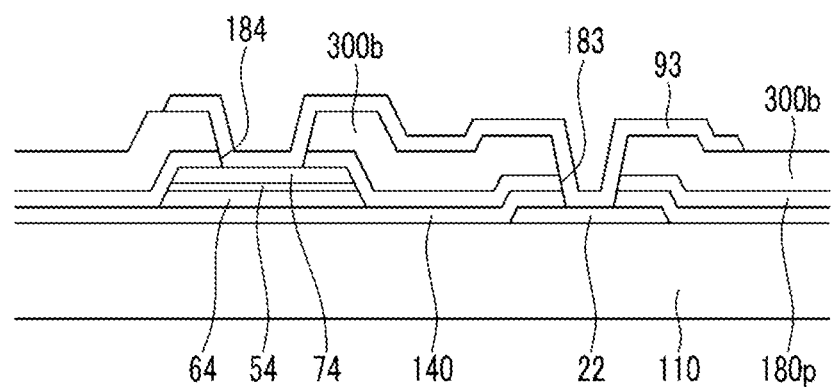
FIG. 70 is a cross-sectional view illustrating the thin film transistor array panel taken along line X-X of FIG. 9 according to exemplary embodiments of the present invention.
Figure 71:
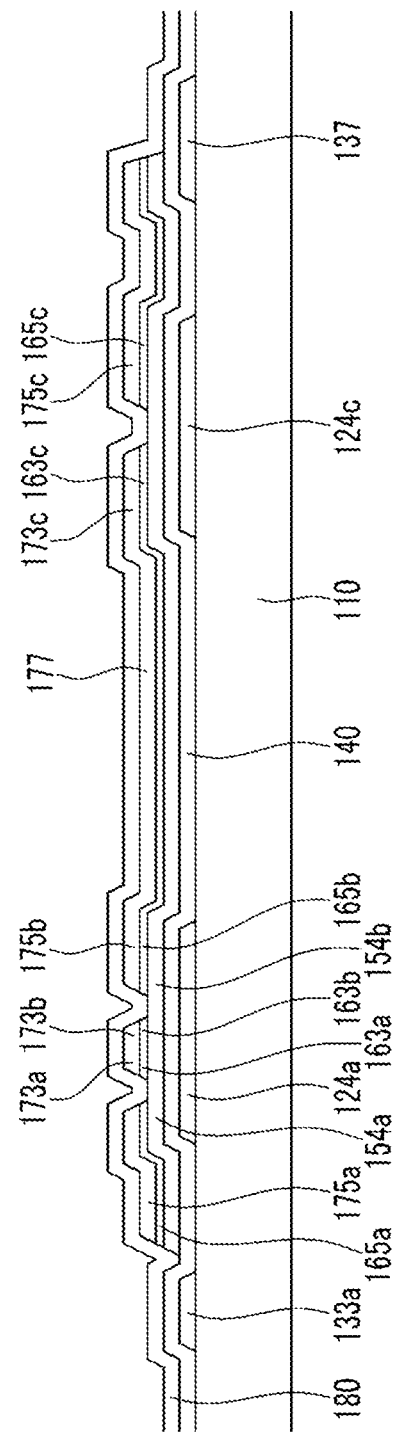
FIGS. 71 to 95 are cross-sectional views sequentially illustrating a manufacturing method of the thin film transistor array panel according to exemplary embodiments of the present invention.
Figure 72:
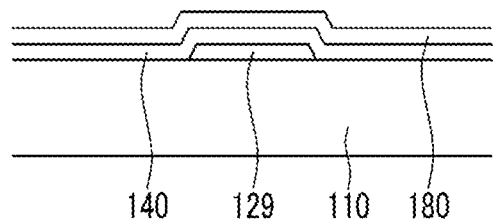
Figure 73:
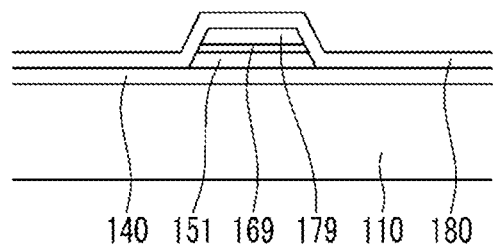
Figure 74:
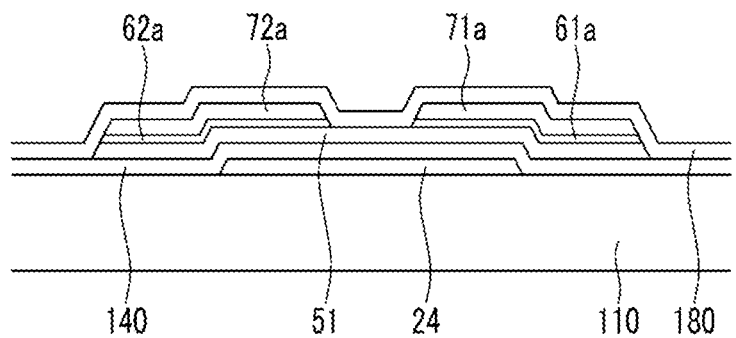
Figure 75:
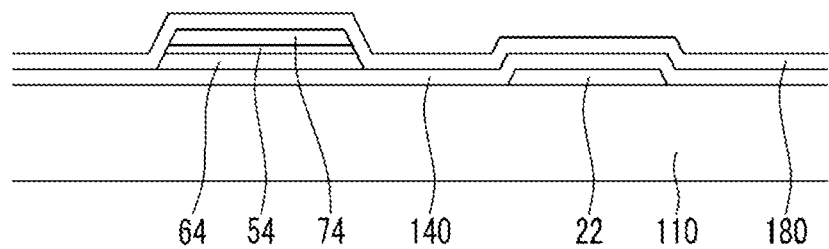
Figure 76:
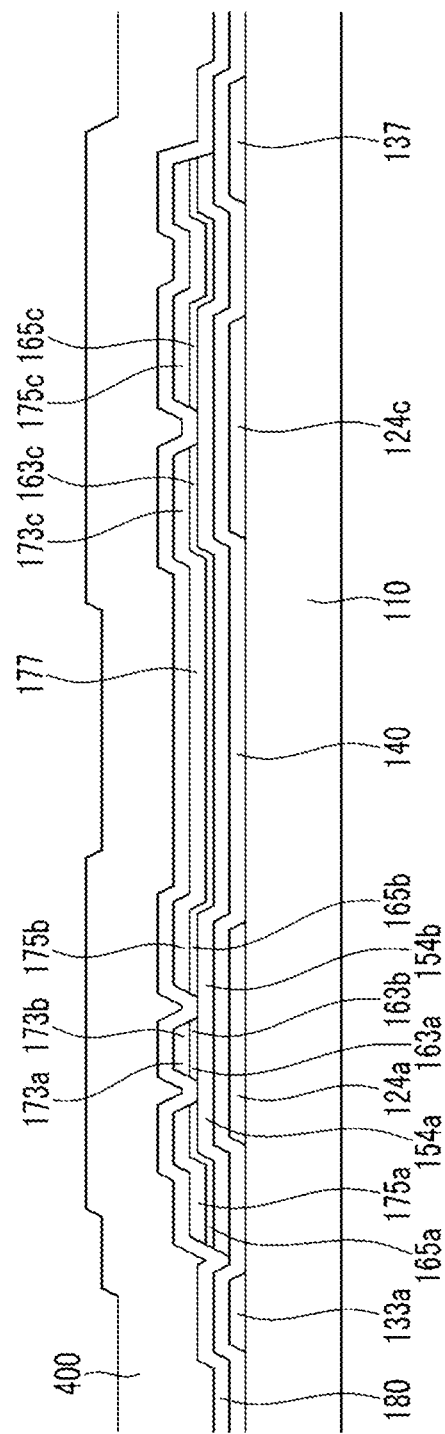
Figure 77:
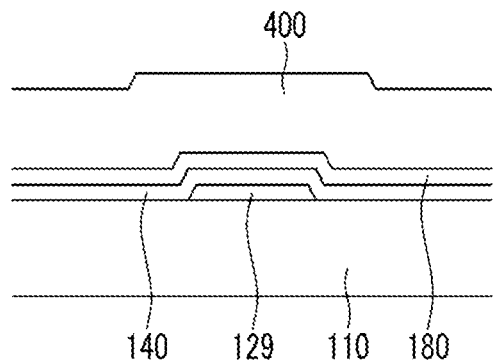
Figure 78:
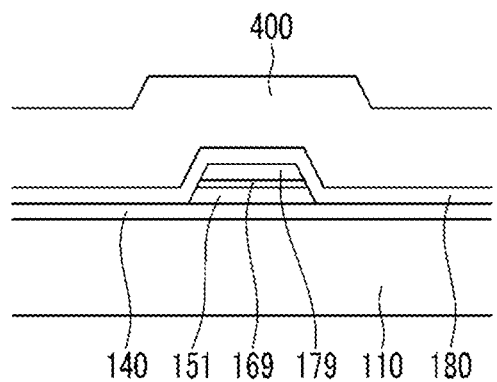
Figure 79:
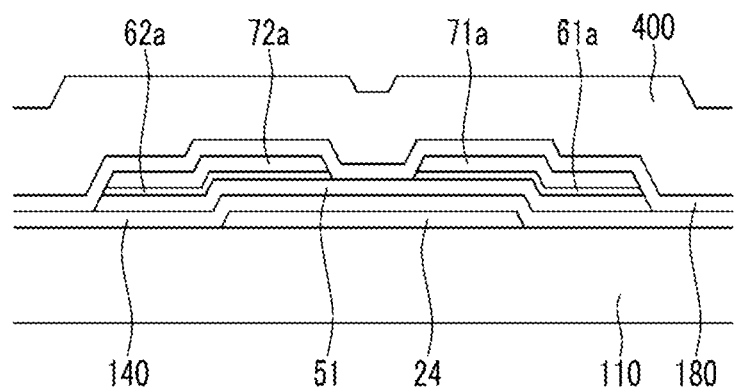
Figure 80:
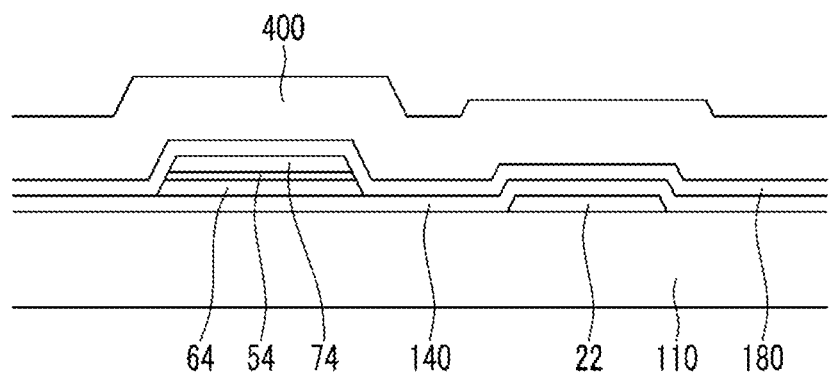
Figure 81:
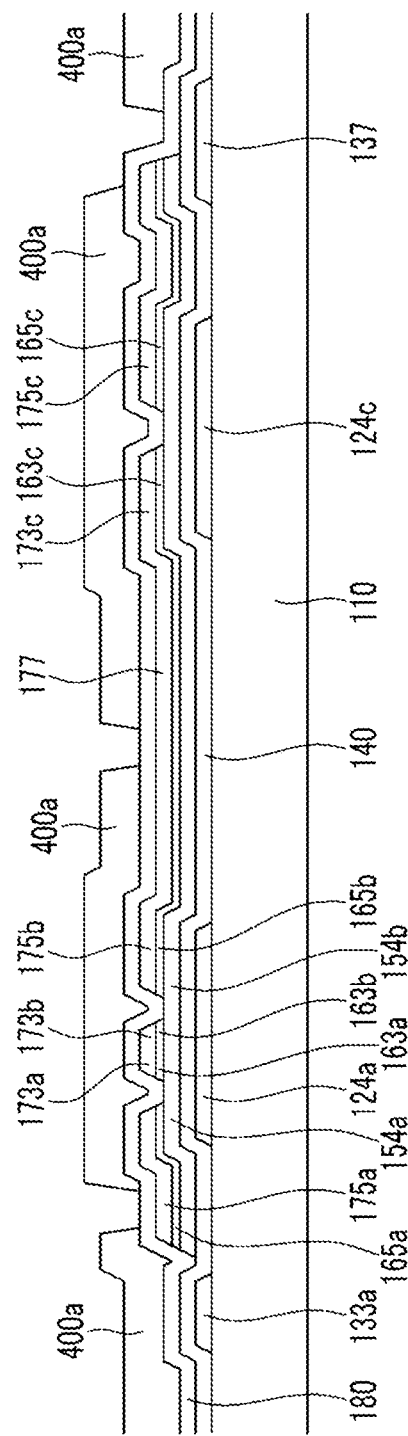
Figure 82:
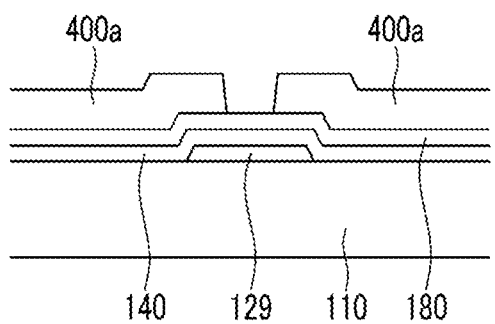
Figure 83:
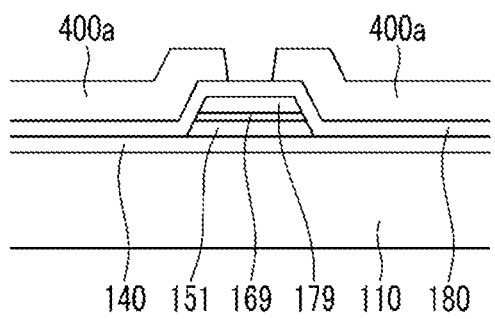
Figure 84:
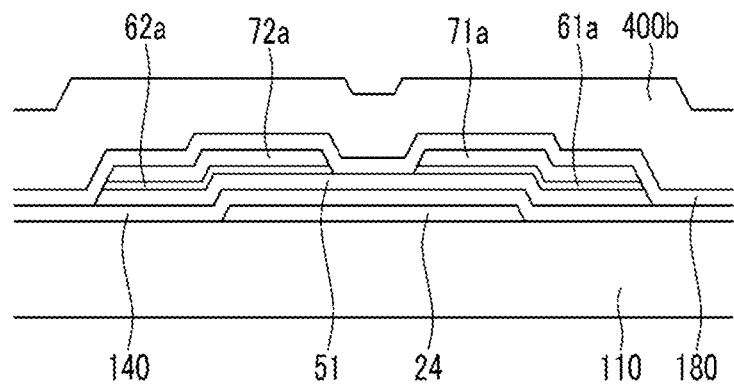
Figure 85:
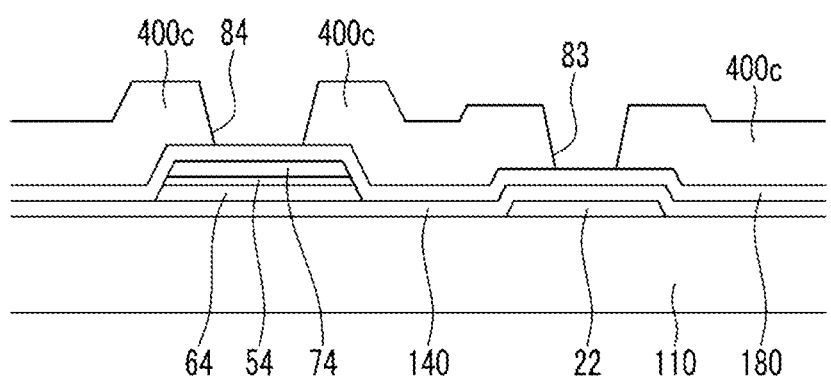
Figure 86:
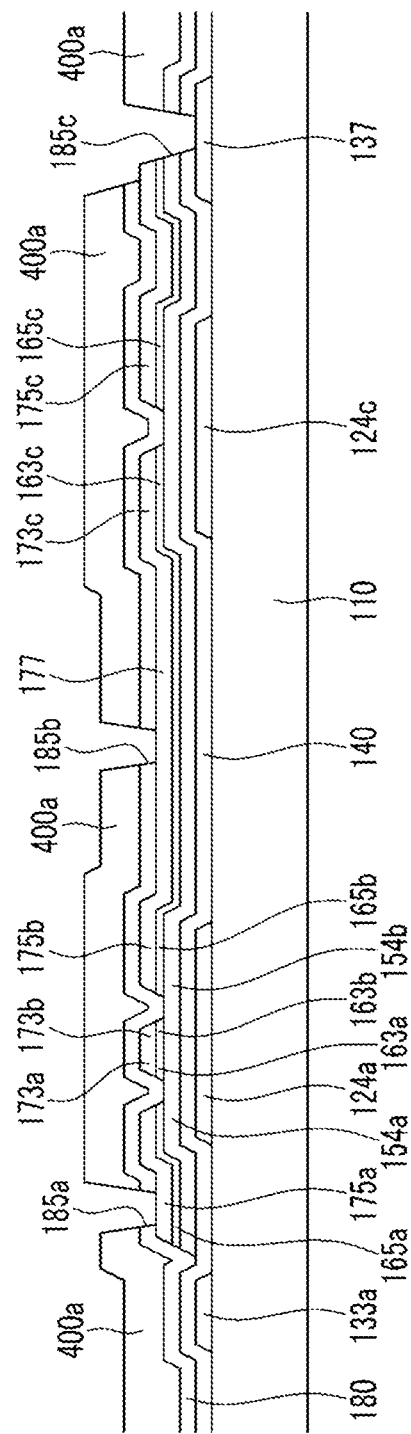
Figure 87:
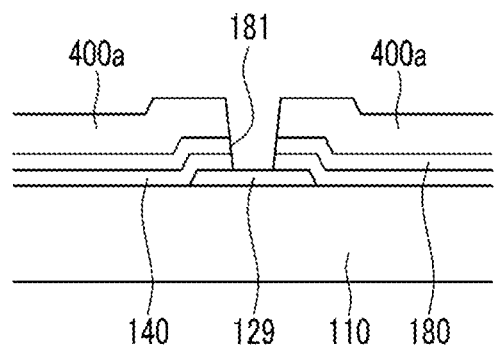
Figure 88:
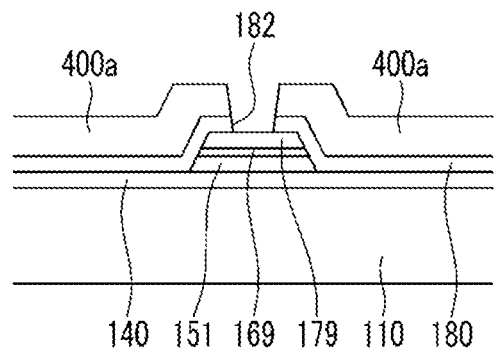
Figure 89:
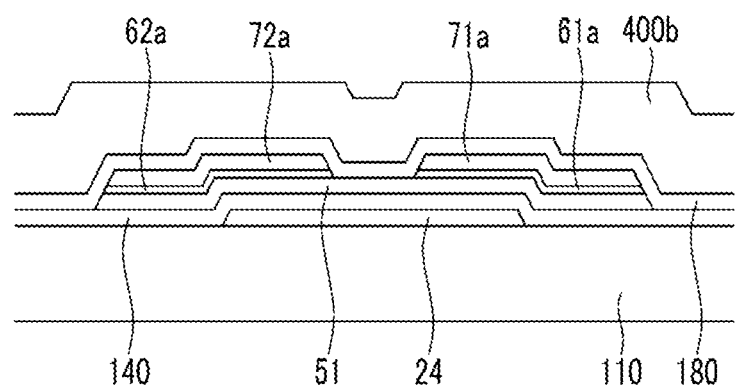
Figure 90:
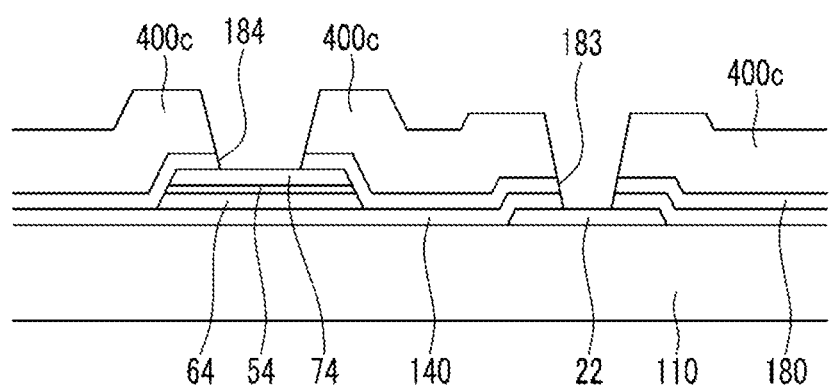
Figure 91:
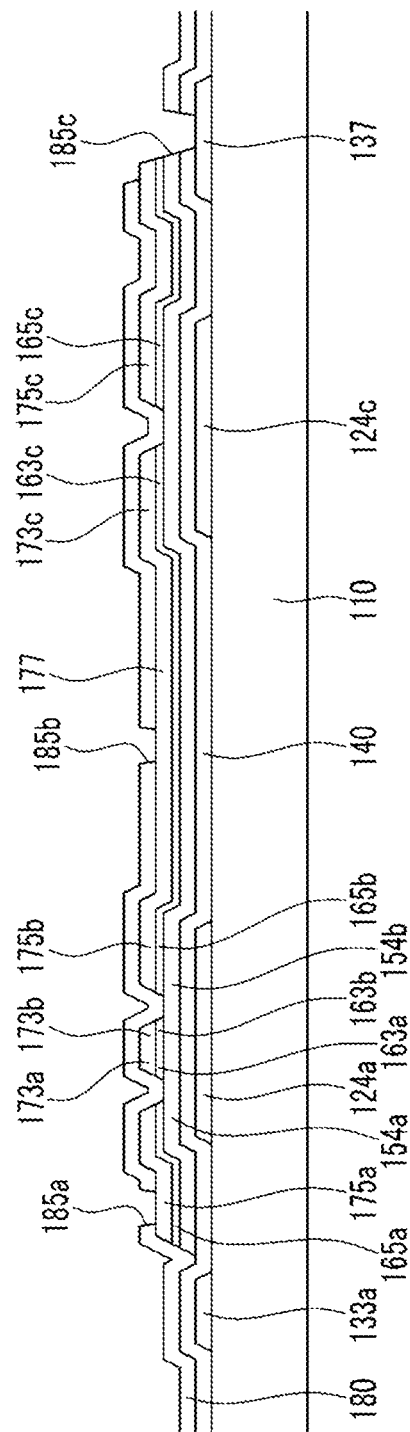
Figure 92:
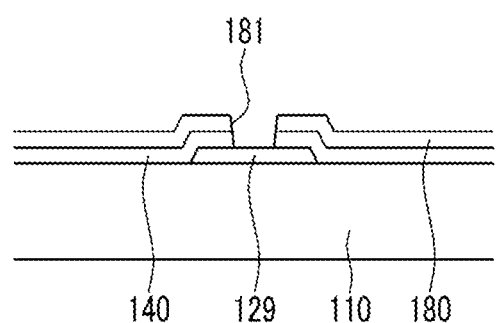
Figure 93:
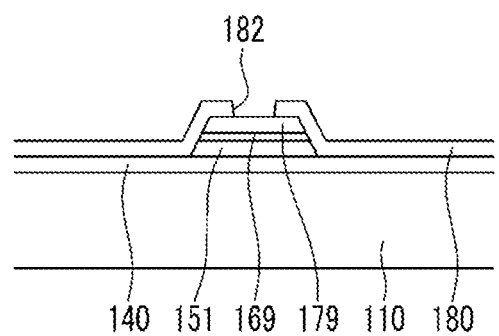
Figure 94:
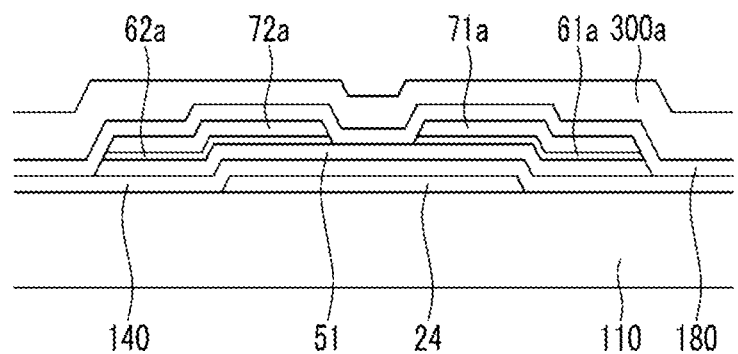
Figure 95:
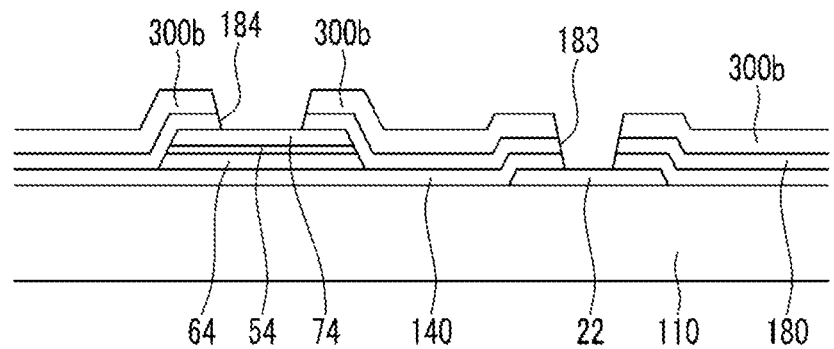

Then, a thin film transistor array panel according to exemplary embodiments of the present invention is described with reference to FIGS. 66 to 70, in addition to FIGS. 2, 7, and 9. FIG. 66 is a cross-sectional view illustrating a thin film transistor array panel taken along line III-III of FIG. 2 according to exemplary embodiments of the present invention. FIG. 67 is a cross-sectional view illustrating the thin film transistor array panel taken along line V-V of FIG. 2 according to exemplary embodiments of the present invention. FIG. 68 is a cross-sectional view illustrating the thin film transistor array panel taken along line VI-VI of FIG. 2 according to exemplary embodiments of the present invention. FIG. 69 is a cross-sectional view illustrating the thin film transistor array panel taken along line VIII-VIII of FIG. 7 according to exemplary embodiments of the present invention. FIG. 70 is a cross-sectional view illustrating the thin film transistor array panel taken along line X-X of FIG. 9 according to exemplary embodiments of the present invention.

Referring to FIGS. 66 to 70 in addition to FIGS. 1, 2, 7, and 9, the thin film transistor array panel according to the exemplary embodiments is similar to the thin film transistor array panels according to the exemplary embodiments described with reference to FIGS. 2 to 10, and 36 to 40. The detailed description of like constituent elements is omitted to avoid unnecessarily obscuring the present invention.

On the insulation substrate 110, the gate conductor 121, 124*a*, 124*b*, 124*c*, 129, 131, 21, 24, and 22 including the gate line 121 and the divided reference voltage line 131, the driving control signal line 21, and the first driving signal transfer line 22 is formed.

The gate insulating layer 140 is formed on the gate conductor 121, 124*a*, 124*b*, 124*c*, 129, 131, 135, 136, 137, 138, 139, 21, 24, and 22.

On the gate insulating layer 140, the semiconductors 154*a*, 154*b*, and 154*c*, the driving semiconductor 51 and the dummy semiconductor 54, the ohmic contacts 163*a*, 165*a*, 163*b*, 165*b*, 163*c*, 165*c*, and 169, and the driving ohmic contacts 61*a* and 61*b* and the dummy ohmic contact 64 are formed. In addition, the data conductor 171, 173*a*, 173*b*, 173*b*, 173*c*, 175*a*, 175*b*, 175*c*, 71, 71*a*, 72, 72*a*, 73, and 74 that includes the plurality of data lines 171 including the first source electrode 173*a* and the second source electrode 173*b*, the first drain electrode 175*a*, the second drain electrode 175*b*, the third source electrode 173*a* and the third drain electrode 175*c*, the driving input signal line 71 including the driving input electrode 71*a*, the driving output signal line 72 including the driving output electrode 72*a*, and the second driving signal transfer lines 73 and 74 is formed.

The passivation layer 180 is formed on the data conductor 171, 173*a*, 173*b*, 173*b*, 173*c*, 175*a*, 175*b*, 175*c*, 71, 71*a*, 72, 72*a*, 73, and 74.

In the passivation layer 180, the first contact hole 185*a* and the second contact hole 185*b* exposing the first drain electrode 175*a* and the second drain electrode 175*b*, the fifth contact hole 182 exposing the data pad 179, and the seventh contact hole 184 exposing a part of the second driving signal transfer lines 73 and 74 are formed.

In the passivation layer 180 and the gate insulating layer 140, the third contact hole 185*c* exposing a part of the reference electrode 137 and a part of the third drain electrode 175*c*, the fourth contact hole 181 exposing the gate pad 129, and the sixth contact hole 183 exposing a part of the first driving signal transfer line 22 are formed On the passivation layer 180 of the peripheral area PA, the first photosensitive film 300*a* and the second photosensitive film 300*b* are positioned. The second photosensitive film 300*b* has an opening corresponding to a position where the sixth contact hole 183 and the seventh contact hole 184 are formed, the sixth contact hole 183 and the seventh contact hole 184 are arranged with the opening of the second photosensitive film 300*b*, and the passivation layer 180 and gate insulating layer 140 are etched and formed by using the second photosensitive film 300*b* having the opening as an etching mask.

The pixel electrode 191 is formed on the passivation layer 180, the first connecting member 193 is formed in the third contact hole 185*c*, and the second connecting member 91 and the third connecting member 92 are formed on the fourth contact hole 181 and the fifth contact hole 182.

The fourth connecting member 93 is formed on the sixth contact hole 183 and the seventh contact hole 184.

However, unlike the thin film transistor array panels according to the exemplary embodiments described above with reference to FIGS. 2 to 10, and 36 to 40, the thin film transistor array panel according to the exemplary embodiments does not include the color filter 230 and the overcoat 80, but includes the passivation layer 180 made of an inorganic insulating layer. Further, the color filter 230 made of the organic insulator or the second passivation layer 180*q* is not positioned in both the peripheral area PA and the display area DA.

In the thin film transistor according to the exemplary embodiments, the first photosensitive film 300*a* and the second photosensitive film 300*b* are positioned in the peripheral area PA of the thin film transistor array panel to protect a driving circuit unit including the driving transistor and the driving signal transfer line from moisture or static electricity. The contact holes 181, 182, 183, 184, 185*a*, 185*b*, and 185*c* are formed in the passivation layer 180 and the gate insulating layer 140 made of inorganic insulating materials, and as a result, heights of the contact holes may be decreased and thus widths of the contact holes are decreased. Accordingly, an inflow amount of moisture or static electricity through the contact hole is decreased. Further, in the process of forming the contact hole, the photosensitive film remains in the peripheral area PA to increase the height of the peripheral area PA, and as a result, heights of the sealant S and a spacer formed in the peripheral area PA may be decreased and thus manufacturing costs may be reduced.

Many features of the thin film transistors according to the exemplary embodiments described with reference to FIGS. 2 to 10, and 35 to 40 all may be applied to the thin film transistor array panel according to the exemplary embodiments.

Then, a manufacturing method of the thin film transistor array panel according to exemplary embodiments of the present invention is described with reference to FIGS. 71 to 95, in addition to FIGS. 2, 7, and 9. FIGS. 71 to 95 are cross-sectional views sequentially illustrating a manufacturing method of the thin film transistor array panel according to exemplary embodiments of the present invention, which are cross-sectional views taken along lines III-III, V-V, and VI-VI of FIG. 2, line VIII-VIII of FIG. 7, and line X-X of FIG. 9.

Referring to FIGS. 71 to 95, the manufacturing method of the thin film transistor according to the exemplary embodiment is similar to the manufacturing methods of the thin film transistor array panels according to the exemplary embodiments described with reference to FIGS. 11 to 35, and 41 to 65.

Referring to FIGS. 71 to 75, on the insulation substrate 110, the gate conductor 121, 124*a*, 124*b*, 124*c*, 129, 131, 21, 24, and 22 including the gate line 121 and the divided reference voltage line 131, the driving control signal line 21, and the first driving signal transfer line 22 is formed. The gate insulating layer 140 is formed on the gate conductor 121, 124*a*, 124*b*, 124*c*, 129, 131, 135, 136, 137, 138, 139, 21, 24, and 22. On the gate insulating layer 140, the data conductor 171, 173*a*, 173*b*, 173*b*, 173*c*, 175*a*, 175*b*, 175*c*, 71, 71*a*, 72, 72*a*, 73, and 74 that includes the plurality of data lines 171 including the semiconductors 154*a*, 154*b*, and 154*c*, driving semiconductor 51 and the dummy semiconductor 54, the ohmic contacts 163*a*, 165*a*, 163*b*, 165*b*, 163*c*, 165*c*, and 169, the driving ohmic contacts 61*a* and 61*b* and the dummy ohmic contact 64, and the first source electrode 173*a* and the second source electrode 173*b*, the driving input signal line 71 including the first drain electrode 175*a*, the second drain electrode 175*b*, the third source electrode 173*a* and the third drain electrode 175*c*, and the driving input electrode 71*a*, and the second driving signal transfer lines 73 and 74 is formed.

The passivation layer 180 is laminated on the data conductor 171, 173*a*, 173*b*, 173*b*, 173*c*, 175*a*, 175*b*, 175*c*, 71, 71*a*, 72, 72*a*, 73, and 74.

Next, as illustrated in FIGS. 76 to 80, the photosensitive film 400 is coated on the passivation layer 180.

By exposing and developing the photosensitive film 400, as illustrated in FIGS. 81 to 85, the first photosensitive film pattern 400*a* is formed on the passivation layer 180 of the display area DA, and the second photosensitive film pattern 400*b* and the third photosensitive film pattern 400*c* are formed on the passivation layer 180 of the peripheral area PA. In this example, the photosensitive film patterns 400*a*, 400*b*, and 400*c* are not positioned at the position where the contact holes 181, 182, 183, 184, 185*a*, 185*b*, and 185*c* are formed. Further, a thickness of the first photosensitive film pattern 400*a* positioned in the display area DA is smaller than thicknesses of the second photosensitive film pattern 400*b* and the third photosensitive film pattern 400*c* positioned in the peripheral area PA.

The thicknesses of the second photosensitive film pattern 400*b* and the third photosensitive film pattern 400*c* which are positioned in the peripheral area PA may be the same as each other, but the third photosensitive film pattern 400*c* has openings 83 and 84 exposing a region that corresponds to a position where a sixth contact hole 183 and a seventh contact hole 184 are positioned.

Next, as illustrated in FIGS. 86 to 90, by using the first photosensitive film pattern 400*a* and the third photosensitive film pattern 400*c* as an etching mask, the passivation layer 180 and gate insulating layer 140 are etched to form the contact holes 181, 182, 183, 184, 185a, 185b, and 185c.

Since the contact holes 181, 182, 183, 184, 185a, 185b, and 185c are formed in the passivation layer 180 made of the inorganic insulating layer and the gate insulating layer 140, the heights of the contact holes may be decreased. Further, an etching time for forming the contact holes 181, 182, 183, 184, 185a, 185b, and 185c is reduced, and as a result, the widths of the contact holes 181, 182, 183, 184, 185a, 185b, and 185c may be decreased.

Next, as illustrated in FIGS. 91 to 95, the first photosensitive film 300a and the second photosensitive film 300b positioned in the peripheral area PA are completed by removing the first photosensitive film pattern 400a and decreasing the heights of the second photosensitive film pattern 400b and the third photosensitive film pattern 400c.

As illustrated in FIGS. 2, 3, 9, and 10, the pixel electrode 191, the first connecting member 193, the second connecting member 91, and the third connecting member 92 are formed in the display area DA, and the fourth connecting member 93 is formed in the peripheral area PA.

As such, according to the manufacturing method of the thin film transistor array panel according to the exemplary embodiment of the present invention, since the contact holes 181, 182, 183, 184, 185a, 185b, and 185c are formed in the passivation layer 180 made of the inorganic insulating layer and the gate insulating layer 140, the heights of the contact holes may be decreased. Further, an etching time for forming the contact holes 181, 182, 183, 184, 185a, 185b, and 185c is reduced, and as a result, the widths of the contact holes 181, 182, 183, 184, 185a, 185b, and 185c may be decreased. Further, in the process of forming the contact hole, the photosensitive film remains in the peripheral area PA to cover and protect the driving transistor and the driving signal transfer line of the peripheral area PA and simultaneously, decrease the heights and the widths of the contact holes of the peripheral area PA, thereby protecting the driving transistor and the driving signal transfer line from external moisture or static electricity. Further, in the process of forming the contact hole, the photosensitive film remains in the peripheral area PA to increase the height of the peripheral area PA, and as a result, heights of the sealant S and a spacer formed in the peripheral area PA may be decreased and thus manufacturing costs may be reduced.

Many features of the manufacturing methods of the thin film transistor array panels according to the exemplary embodiments described above with reference to FIGS. 11 to 35, and 41 to 65 all may be applied to the manufacturing method of the thin film transistor array panel according to the exemplary embodiments.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
   a substrate comprising a display area comprising a plurality of pixels and a peripheral area outside the display area;
   a gate line and a data line disposed in the display area;
   a first driving signal transfer line and a second driving signal transfer line disposed in the peripheral area;
   a first insulating layer disposed on the gate line and the data line; and
   a first photosensitive film disposed on the first driving signal transfer line and the second driving signal transfer line,
   wherein the first photosensitive film is disposed only in the peripheral area.

2. The thin film transistor array panel of claim 1, wherein the first insulating layer comprises an organic insulator.

3. The thin film transistor array panel of claim 2, wherein the first insulating layer is a color filter.

4. The thin film transistor array panel of claim 3, further comprising:
   a second insulating layer disposed on the first insulating layer.

5. The thin film transistor array panel of claim 2, further comprising:
   a third insulating layer disposed in the display area and the peripheral area, the third insulating layer being disposed below the first insulating layer and the first photosensitive film pattern.

6. The thin film transistor array panel of claim 2, further comprising:
   a thin film transistor connected to the gate line and the data line; and
   a pixel electrode connected to the thin film transistor and disposed on the first insulating layer,
   wherein the pixel electrode comprises a plurality of minute branches.

7. The thin film transistor array panel of claim 6, wherein:
   the plurality of minute branches of the pixel electrode extend in a plurality of different directions.

8. The thin film transistor array panel of claim 1, further comprising:
   a thin film transistor connected to the gate line and the data line; and
   a pixel electrode connected to the thin film transistor and disposed on the first insulating layer,
   wherein the pixel electrode comprises a plurality of minute branches.

9. The thin film transistor array panel of claim 8, wherein:
   the plurality of minute branches of the pixel electrode extend in a plurality of different directions.

* * * * *